(12) United States Patent
Pathmanathan

(10) Patent No.: US 10,712,923 B1
(45) Date of Patent: Jul. 14, 2020

(54) SYSTEM AND METHOD FOR DESIGNING INTERIOR SPACE

(71) Applicant: Magick Woods Exports Private Limited, Kancheepuram (IN)

(72) Inventor: Indrakumar Pathmanathan, Ontario (CA)

(73) Assignee: Magick Woods Exports Private Limited, Kancheepuram (IN)

(*) Notice: Subject to any disclaimer, the term of this patent is extended or adjusted under 35 U.S.C. 154(b) by 0 days.

(21) Appl. No.: 16/373,484

(22) Filed: Apr. 2, 2019

(51) Int. Cl.
| G06F 3/048 | (2013.01) |
| G06F 3/0484 | (2013.01) |
| G06F 3/0482 | (2013.01) |
| G06F 3/0481 | (2013.01) |
| G06F 30/00 | (2020.01) |
| G06Q 30/06 | (2012.01) |
| G06Q 30/02 | (2012.01) |

(52) U.S. Cl.
CPC ........ G06F 3/04847 (2013.01); G06F 3/0482 (2013.01); G06F 3/04815 (2013.01); G06F 3/04845 (2013.01); G06F 30/00 (2020.01); G06Q 30/0283 (2013.01); G06Q 30/0639 (2013.01)

(58) Field of Classification Search
CPC .. G06F 3/04847; G06F 30/00; G06F 3/04815; G06F 3/0482; G06F 3/04845; G06Q 30/0283; G06Q 30/0639
USPC ........................................................ 715/765
See application file for complete search history.

(56) References Cited

U.S. PATENT DOCUMENTS

| 7,277,572 | B2* | 10/2007 | MacInnes | G06F 17/5004 345/419 |
| 9,471,996 | B2* | 10/2016 | Maillot | G06T 11/001 |
| 9,483,584 | B2* | 11/2016 | Batra | G06F 30/00 |
| 9,953,370 | B2* | 4/2018 | Pershing | G06Q 40/00 |
| 10,025,473 | B2* | 7/2018 | Sarao | G06F 3/04842 |
| 10,223,740 | B1* | 3/2019 | Gore | G06T 19/003 |
| 10,592,589 | B1* | 3/2020 | Hsu | G06F 40/166 |
| 2002/0010655 | A1* | 1/2002 | Kjallstrom | G06Q 30/02 705/26.62 |
| 2009/0138113 | A1 | 5/2009 | Hoguet | |
| 2009/0160856 | A1* | 6/2009 | Hoguet | G06Q 10/10 345/420 |
| 2009/0271742 | A1* | 10/2009 | Zhang | G06F 9/451 715/854 |
| 2010/0198563 | A1* | 8/2010 | Plewe | G06F 30/392 703/1 |

(Continued)

Primary Examiner — David Phantana-angkool
(74) Attorney, Agent, or Firm — Klarquist Sparkman, LLP

(57) ABSTRACT

An interior designing system is configured to select and review furnishings and fixtures for a room, and to visualize the selected furnishings and fixtures in a room layout. The interior designing system includes at least one user interface including at least one display and at least one input and at least one computer having at least one processor, random access memory, and permanent memory. The at least one processor is configured to display a selected room layout and a plurality of objects that can be placed within the selected room layout receive a selection of a first object, one or more positional parameters of the first object within the selected room layout, modify, based on user input, one or more design parameters of the first object, and render one or more of a photorealistic 3D or 2D view of the first object within the selected room layout.

13 Claims, 27 Drawing Sheets

(56) References Cited

U.S. PATENT DOCUMENTS

2012/0259743 A1 10/2012 Pate, Jr.
2013/0222393 A1* 8/2013 Merrell .................. G06T 11/00
 345/441
2015/0170260 A1* 6/2015 Lees .................. G06Q 30/0643
 705/27.2

* cited by examiner

SYSTEM AND METHOD FOR DESIGNING INTERIOR SPACE

TECHNICAL FIELD

The present disclosure generally relates to systems and methods for designing an interior space. More particularly, the present disclosure relates to systems and methods for modifying (e.g., adding and manipulating 3D objects in) the interior space (e.g., in a housing/office) and subsequently rendering a photographic perspective of the modified interior space.

BACKGROUND

Generally, designing of homes/offices (and interior spaces/rooms therein) requires a decorator/designer visiting the home/office and inspecting (noting dimensions of) the spaces/rooms therein. Thereafter, the decorator/designer formulates a number of virtual photographic representations of the spaces/rooms for an owner of the home/office to browse through.

Each photographic/pictorial representation may be a virtual rendition of the room having a number of objects (n>1) disposed therein. For example, one photographic/pictorial representation of a kitchen of the home/office may illustrate twelve cupboards, one chimney, two sinks and a refrigerator spacing. On the other hand, another photographic/pictorial representation may illustrate ten cupboards, two sinks, one chimney and a refrigerator spacing.

The home/office owner may approve one specific photographic/pictorial representation. Subsequently, the decorator/designer initiates production of the objects represented in the photographic/pictorial representation. After competition of the production process, servicemen arrive at the home/office premises to install the manufactured objects (in the same way as depicted in the approved photographic/pictorial representation). However, such a process consumes a lot of time and does not allow for the owner to customize the objects. Additionally, such a process of designing a pre-defined space does not allow a user to estimate the cost of manufacturing and/or installing the objects.

US patent application number 20120259743A1 (hereinafter referred to as US20120259743A1) teaches a system and method for providing a user with the capability of selecting from among various particular products utilized in the design of an interior space, such as a kitchen, reviewing product specifications, design and finish combinations, and visualizing the products, both in isolation and placed in a photorealistic depiction of the selected products in one of a selected number of different room layouts.

SUMMARY

In an aspect of the present disclosure, an interior designing system is disclosed. The interior designing system is configured to select and review furnishings and fixtures for a room, and to visualize the selected furnishings and fixtures in a room layout. The interior designing system includes at least one user interface including at least one display and at least one input device. The interior designing system also includes at least one computer having at least one processor, random access memory, and permanent memory. The at least one processor is configured to display a selected room layout and a plurality of objects that can be placed within the selected room layout and receive a selection of a first object and one or more positional parameters of the first object within the selected room layout. The at least one processor is further configured to modify, based on user input, one or more design parameters of the first object, and render one or more of a photorealistic 3D or 2D view of the first object within the selected room layout.

In an aspect of the present disclosure, a method is disclosed. The method is for selecting and reviewing furnishings and fixtures for a room and for visualizing the selected furnishings and fixtures in a room layout. The method includes displaying, on a display, a selected room layout and a plurality of objects that can be placed within the selected room layout. The method further includes receiving, by a processor, a selection of a first object and one or more positional parameters of the first object within the selected room layout from at least one user interface. The method further includes modifying, by the processor, based on user input, one or more design parameters of the first object. Furthermore, the method includes rendering, by the processor, one or more of a photorealistic 3D or 2D view of the first object within the selected room layout.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts.

Figure 1:
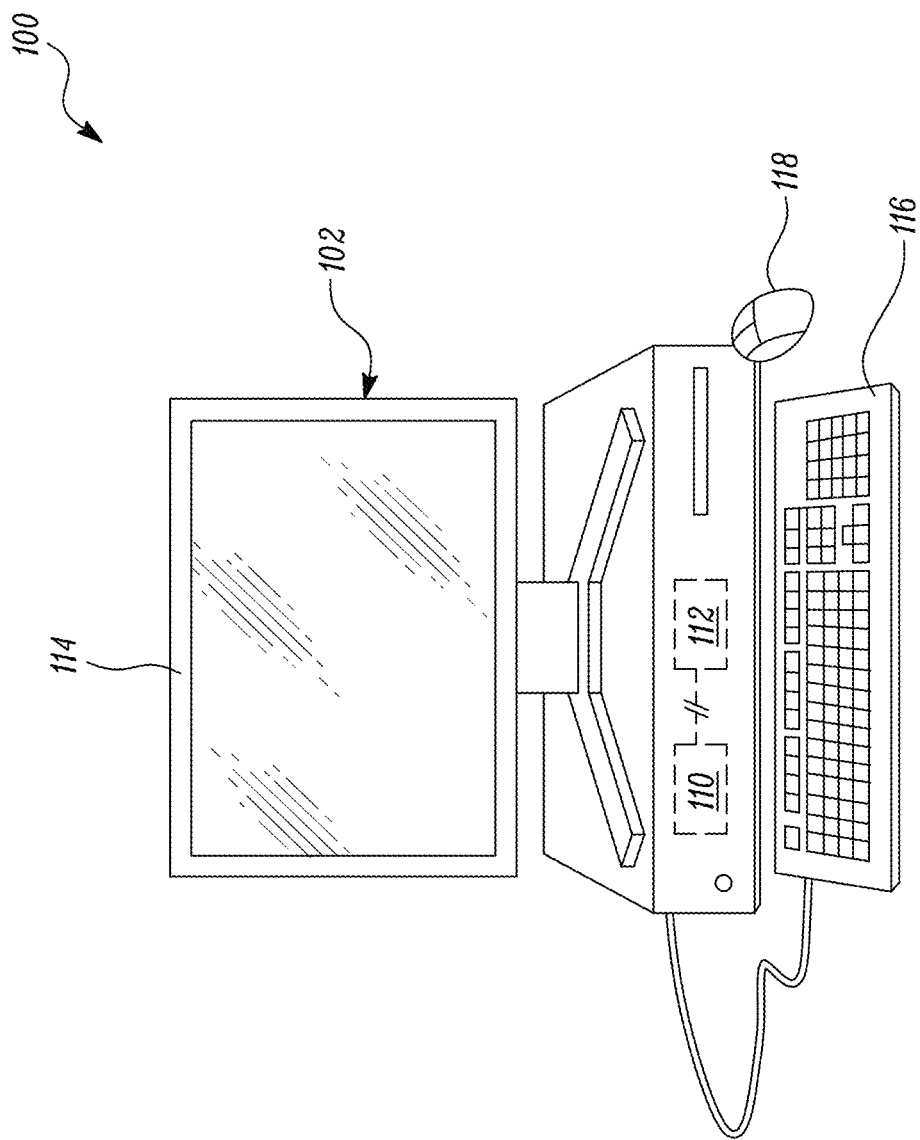
FIG. 1 shows an interior designing system, in accordance with an embodiment of the present disclosure.
Figure 2:
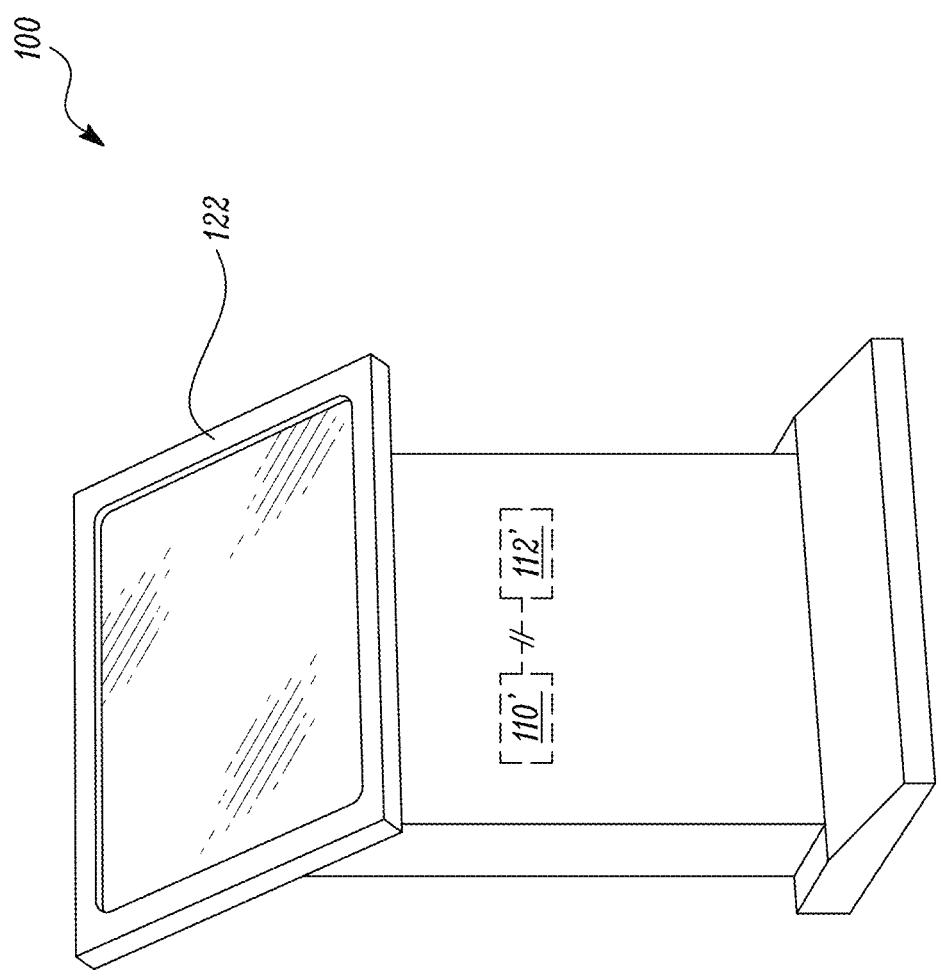
FIG. 2 shows the interior designing system, in accordance with an alternate embodiment of the present disclosure.

Referring to FIGS. 1 and 2, an interior designing system 100 is disclosed. The interior designing system 100 typically includes one or more computer systems 102. Each computer system 102 includes a memory 110 adequate to store the system program and the associated graphics files, and conventional operating system, such as Microsoft Windows XP®, or other comparable operating system.

The computer system 102 may be configured to operate according to one or more algorithms. The computer system 102 may include one or more processors 112 (in the form of one or more of a microprocessor, a microcontroller, or any other suitable means) for executing instructions/algorithms/computations. The algorithms/instructions may be retrievably stored within the memory 110. The memory 110 may include non-transitory computer-readable medium or memory, such as a disc drive, flash drive, optical memory, read-only memory (ROM), or the like. In an example, the computer system 102 may utilize an Intel® i5 CPU as the processor 112, with 4 Gigabytes of random-access memory ("RAM"), a 250 GB 7200 rpm removable hard disc drive ("HDD") with pre-loaded drive image for storing the system program and image files, as the memory 110. The computer system 102 may also include a display (a high definition monitor 114), such as an active matrix LCD/TFT or an LED display. The computer system 102 may also include various other user input devices such as a keyboard 116, mouse 118, or joystick (not shown).

In an alternate embodiment, the interior designing system 100 may include one or more computer systems 102 in the form of a kiosk 120 having a relatively large, high-resolution display (flat-panel display 122), processors 112' (similar to processor 112) and a memory 110' (similar to memory 110). In the embodiment illustrated in FIG. 2, the kiosk 120's display 122 includes a touch sensitive screen, thereby allowing the user to navigate between screen representations to initiate product review, selection, and room visualizations quickly, and in a sequence desired by the user. It will be appreciated that the disclosed interior designing system 100 may employ one or more user stations (shown in FIG. 2), including one or more kiosks 120. It will be appreciated that employing multiple kiosks 120 allows multiple users to utilize the disclosed system simultaneously and/or at multiple locations. It will similarly be appreciated that the disclosed system may employ a single computer, or multiple computers connected via a local area network (LAN), a wide area network (WAN), a private intranet, the Internet.

In the interior designing system 100, as disclosed herein, the memory 110 of the one or more computer systems 102 may be adequate to store and run a separate computer-aided design ("CAD") program of the type that are currently commercially available and utilized by contractors, designers, and retailers to assist customers in room design and layout, so that the system can be utilized by the customer and dealer to generate a CAD layout of, for example, a kitchen, while at the same time providing the customer with the product choice and visualization provided by the disclosed interior designing system 100.

The one or more computer systems 102 are suitably programmed (to provide a user interface that is employed interactively by one or more users to review brand and model (or "series") information, as well as product specifications, design and finish combinations for a preselected set of products, and to visualize certain of the products, both in isolation and placed in a full color photorealistic depiction of the selected products in one of a selected number of different room layouts. More specifically, specific instructions/computations/algorithms may be stored in the memory 110. The processors 112 of the one or more computer systems 102 may retrieve such instructions/computations/algorithms and execute them to enable a user to review products, as well as product specifications, design and finish combinations for the preselected set of products, and to visualize certain of the products, both in isolation and placed in a full color photo-realistic depiction of the selected products in one of a selected number of different room layouts.

The memory 110 may also have instructions/computations/algorithms that when executed by the processors 112 allows a user to access product data, including specifications, written descriptions, demonstrative videos, and simple and/or enhanced images of the products, and/or selected components and/or features of those products.

The one or more computer systems 102 are also suitably programmed to provide two-dimensional and three-dimensional renderings of one or more of a preselected number of room/spaces layouts whenever one such layout is selected by the user for visualization. More specifically, specific instructions/computations/algorithms may be stored in the memory 110 where the said instructions/computations/algorithms are associated with the one or more preselected room/spaces layouts. The processors 112 of the one or more computer systems 102 may retrieve the said specific instructions/computations/algorithms from the memory 110 and provide two-dimensional and three-dimensional renderings of one or more of a preselected number of room/spaces layouts whenever one such layout is selected by the user for visualization. In addition to the two-dimensional and three-dimensional rendering of the room/spaces layout, special photorealistic color renderings of each of the product designs, features, textures and colors are provided and stored in the memory 110 so that the computer systems 102 (more specifically, the processor 112, upon receipt of request from user) may retrieve the appropriate photorealistic renderings corresponding to the set of products/designs/features/colors selected for visualization in the selected room layout. It may be contemplated that the data pertaining to the objects, room layouts (kitchens, bedrooms and bathrooms), the image rendering data, may be stored in the memory 110 on one or more computer systems 102 (as described here) or at the location of the kiosk 120 or at a remote memory server location.

Figure 3:
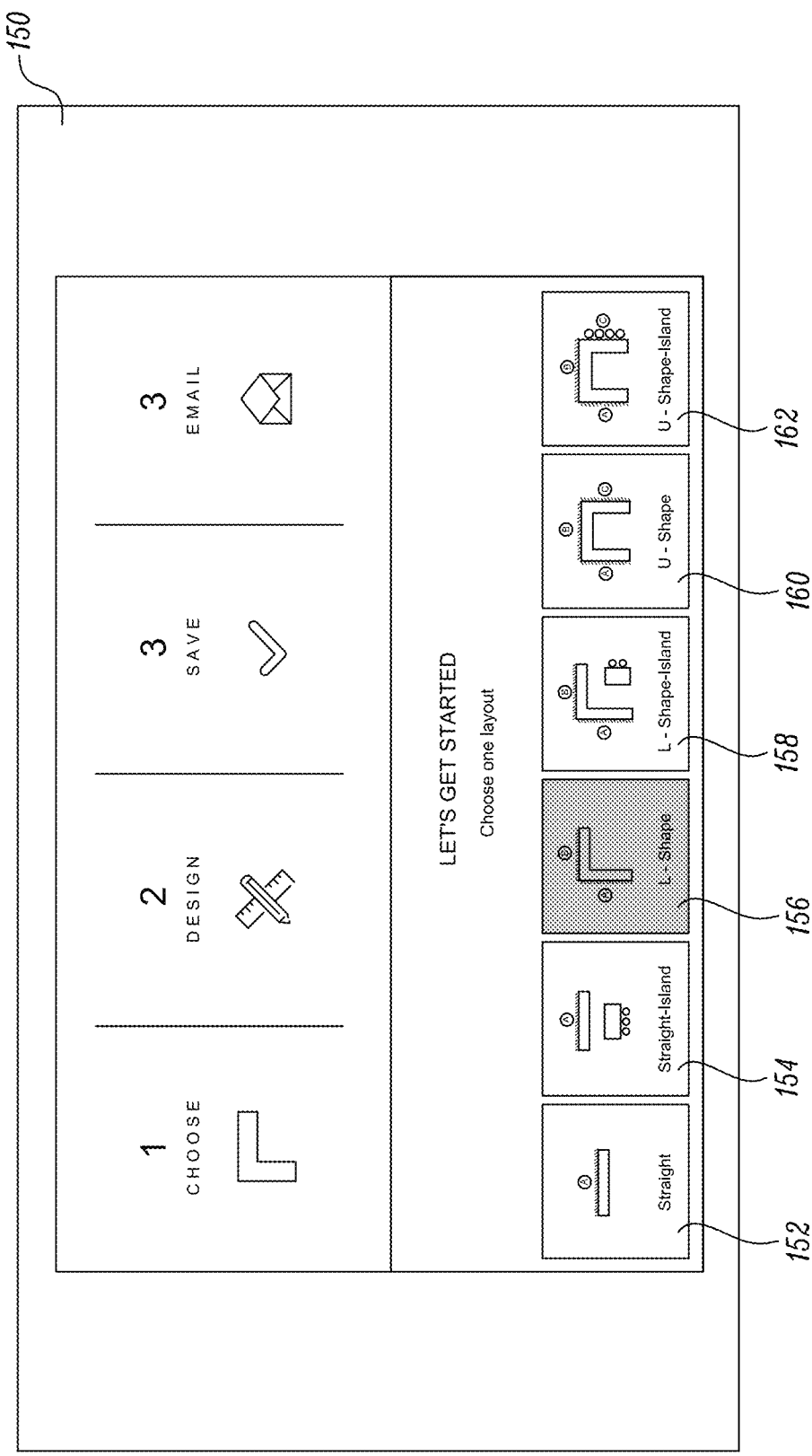
FIG. 3 illustrates a visual on a display of the interior designing system, in accordance with an embodiment of the present disclosure.

The operation/working of the interior designing system 102, by a user will now be explained in detail with the help of exemplary scenarios. FIG. 3 depicts the visuals employed as the startup screen 150 on a display (i.e. on the high definition monitor 114 and flat panel display 122 as shown in FIG. 1 and FIG. 2), by the processor 112 (as shown in FIG. 1). The start-up screen 150 includes sample depictions of room layout in the form of icons (as shown at 152, 154, 156, 158, 160, 162). The room layout depictions are selectable icons that may allow the user to select one from a preselected number of alternative room layouts 152, 154, 156, 158, 160 and 162 (that are configured to be enhanced using all of the various products, styles, colors, textures, and other selectable features selected by the user to form and depict a user-defined photo realistic visualization of the user's selected products in the selected room layout). In the embodiment illustrated, the room layouts are for a kitchen. However, it may be contemplated that in various other embodiments the rooms layouts may be for a bedroom, drawing room, bathroom and other such rooms/interior spaces.

In the embodiment illustrated, the processor 112 may be programmed such that upon execution of instructions/algorithms to display the start-up screen 150, the user is also prompted to select a specific room layout from the numerous room layouts 152, 154, 156, 158, 160 and 162. The prompt may be in the form of a pre-recorded audio message, a message displayed on the screen 150 (i.e. either on the high definition monitor 114 or on flat panel display 122 as shown in FIG. 1 and FIG. 2) or in any other way known in the art. In the embodiment illustrated, the start-up screen 150 displays a message "LETS GET STARTED" and "choose one layout" to prompt a selection of a room layout by the user.

Figure 4:
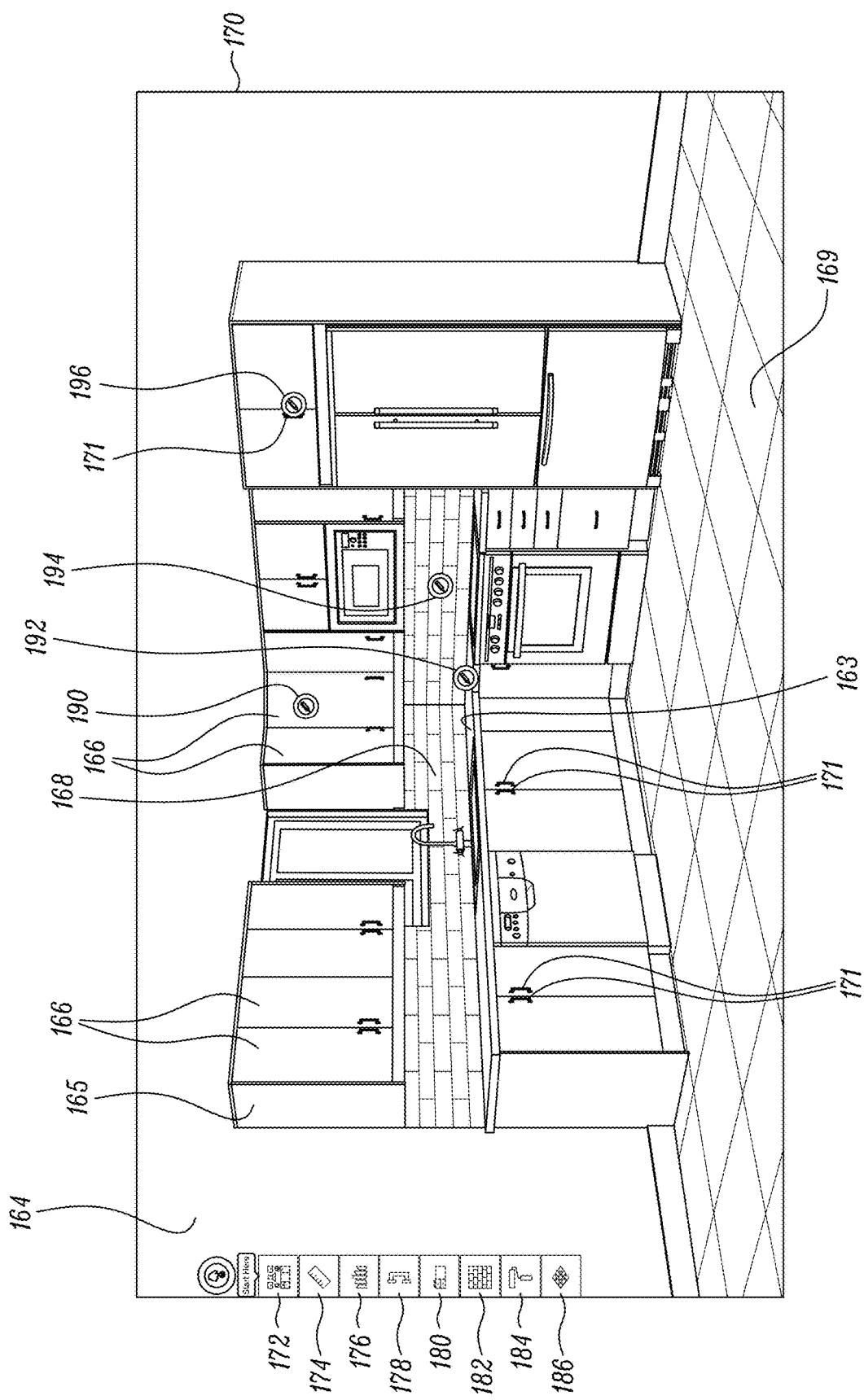
FIG. 4 illustrates a new visual displayed on a display of the interior designing system, in accordance with an embodiment of the present disclosure.

Selection of a specific room layout opens a display 170 (on the high definition monitor 114 or on flat panel display 122) having the selected layout. For example, in an embodiment, the information that the room layout 156 has been selected by the user on touch screen display 122 or via mouse 118, may be transmitted to the processor 112. Upon receipt of such information, the processor 112 runs instructions/computations for opening a new enlarged view of the room layout 156. FIG. 4 illustrates the new display 170 depicting an enlarged view of the room layout 156 with pre-installed objects. In the exemplary embodiment illustrated, the memory 110 may have suitable logic circuitry and instructions stored therein to display pre-installed objects in the selected room layout 156. For example, in the embodiment under discussion, after selection of the room layout, the processor 112 may be configured to execute instructions to display the pre-installed objects in new display 170 such as countertops 163, walls 164, cupboard 165 having pivotable doors 166, wall tiles 168, flooring 169 and cupboard handles 171.

The processor 112 and the memory 110 may have suitable logic and instructions, respectively, to allow the user with the ability to customize the pre-installed objects (countertops 163, walls 164, cupboard 165 having pivotable doors 166, wall tiles 168, flooring 169 and cupboard handles 171). For example, the processor 112 may have executed instructions/algorithms stored in the memory 110 to display icons 172, 174, 176, 178, 180, 182, 184 and 186 provided on the left side of the display 170 for allowing the user to customize the aesthetic appearance of the pre-installed objects and the room layout. For the purpose of better illustration of the ongoing disclosure reference will be made to FIG. 5, FIG. 6, FIG. 7, FIG. 8, FIG. 9, FIG. 10, FIG. 11 and FIG. 12.

Figure 5:
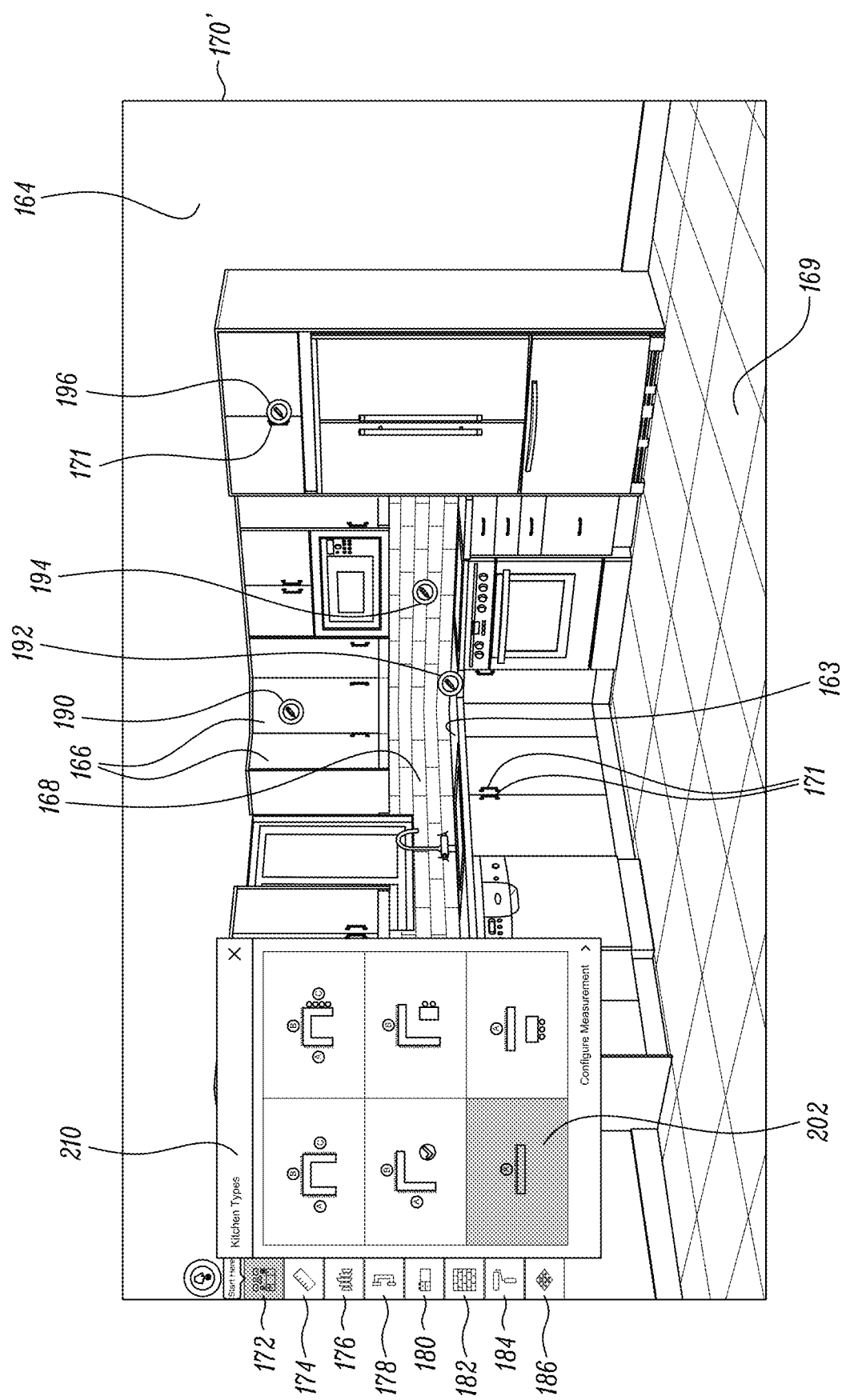
FIGS. 5-13 illustrate visuals displayed on a display of the interior designing system in response to selection of icons, in accordance with an embodiment of the present disclosure.
Figure 6:
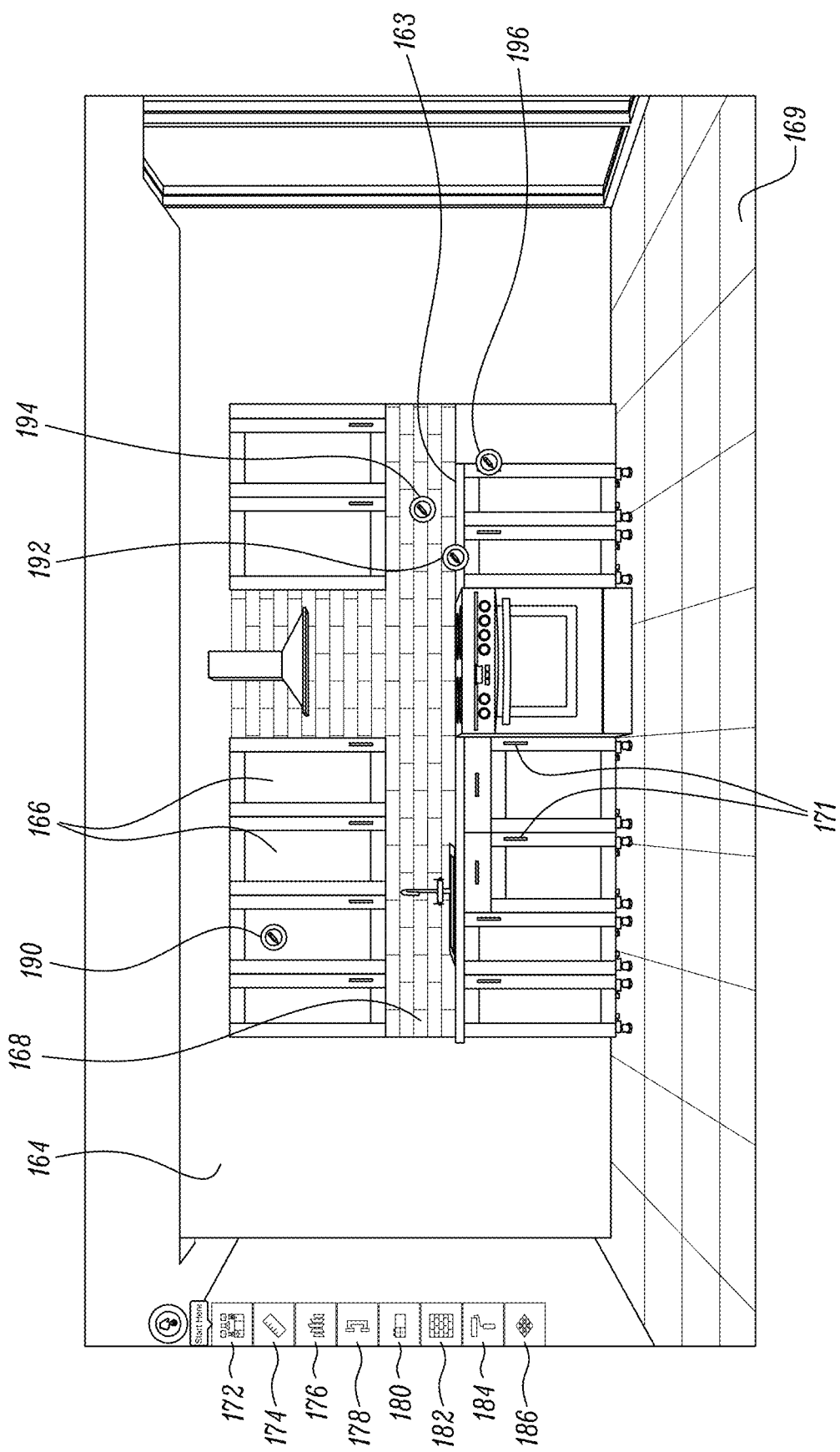

FIG. 5 illustrates the display 170' (on high definition monitor 114 or on flat panel display 122) when the icon 172 is selected by the user. More specifically, FIG. 5 illustrates the display 170 generated by the processor 112 when the processor 112 executes certain pre-stored instructions stored in the memory 110 in response to selection of the icon 172. The menu 210 illustrates the layouts that can be displayed by the interior designing system 100. In the embodiment illustrated, the user had chosen an 'L-shaped' layout via icon 156. However, the user may want to edit such a layout. The icon 172 provides for such a provision i.e. upon selection of the icon 172, the processor 112 executes a set of instruction stored in the memory 110 and displays the menu 210. Using the menu 210, the user may edit the layout. For example, the user may choose layout 202 in menu 210. Upon receiving information that the user selected layout 202 of menu 210, the processor 112 may execute pre-stored instruction in the memory 110 to display an enlarged view of layout 202 with pre-installed objects, as shown in FIG. 6.

Figure 7:
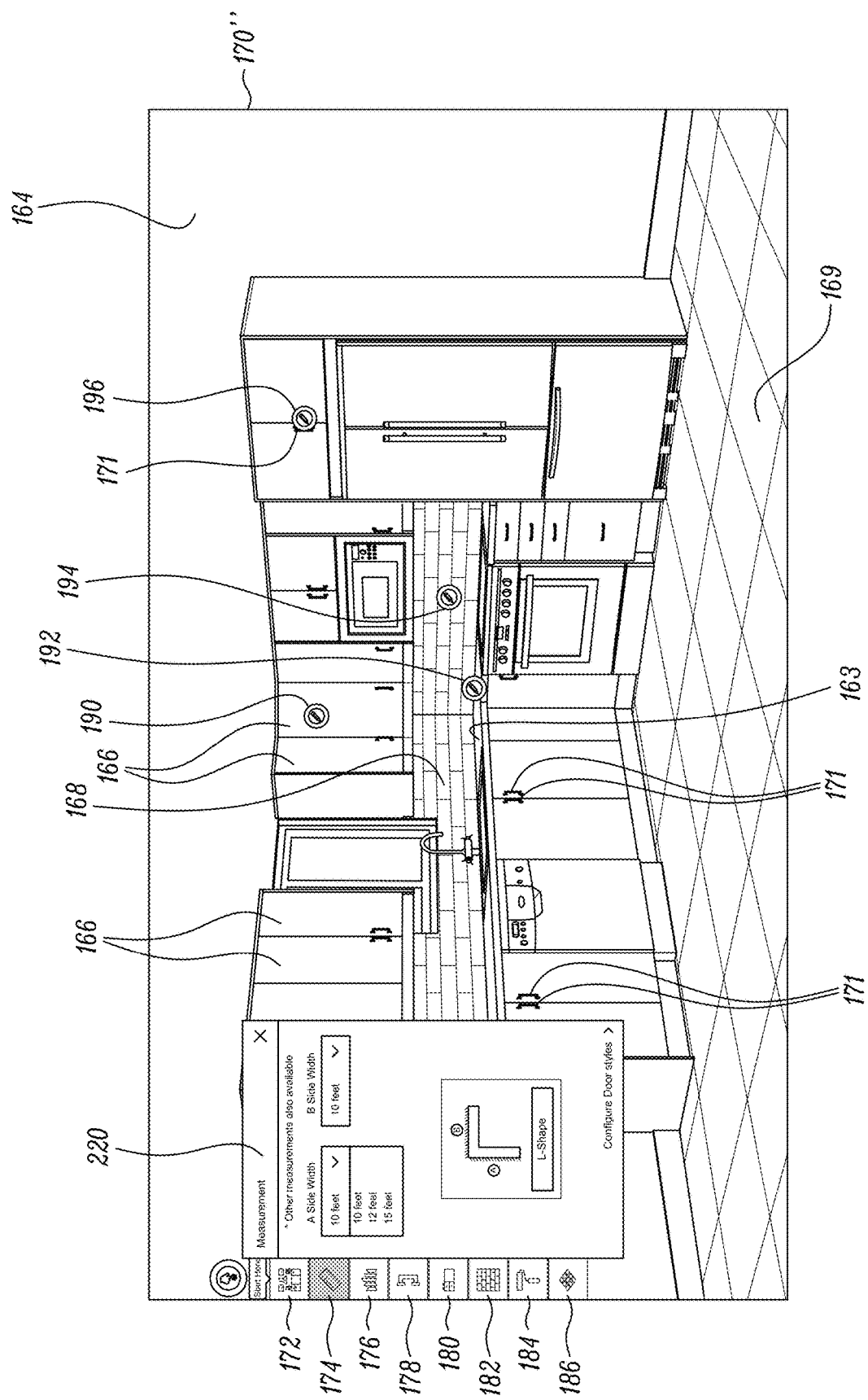

FIG. 7 illustrates the display when icon 174 is selected by the user. More specifically, FIG. 7 illustrates the display 170" generated by the processor 112, on the display of the interior designing system 100, in response to selection of icon 174. The display 170" displays a menu 220 displaying dimension of the room that can be customized (i.e. objects can be placed/installed and edited within the chosen room dimension). For example, FIG. 7 illustrates that the width of one wall in the room layout that can be customized is 10 feet. However, the menu 220 provides as a mean to edit the dimension (wall width) to 12 feet, 15 feet or any other dimension (as desired by the user) using the range of options provided in the menu 230.

Figure 8:
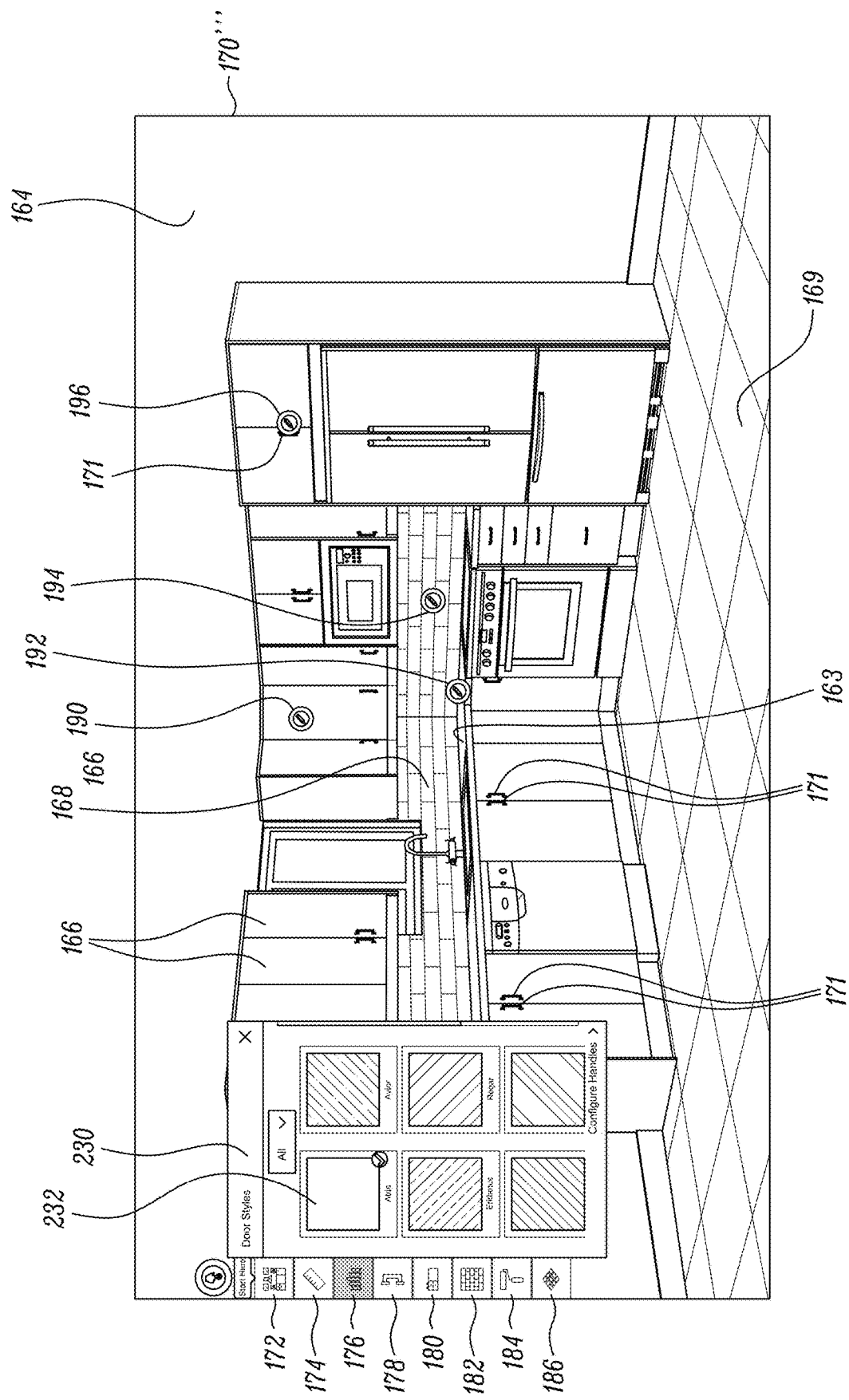

FIG. 8 illustrates the visuals (on high definition monitor 114 or on flat panel display 122) when icon 176 is selected by the user. More specifically, FIG. 8 illustrates the display 170''' generated by the processor 112 (on high definition monitor 114 or on flat panel display 122) in response to selection of icon 176. The visual display 170''' displays a menu 230 displaying the kind of pattern that can be present on the pivotable door 166. For example, icon 232 of FIG. 8 illustrates the door 166's physical appearance. However, the menu 230 provides as a mean to edit the physical appearance of the door 166 (as desired by the user).

Figure 9:
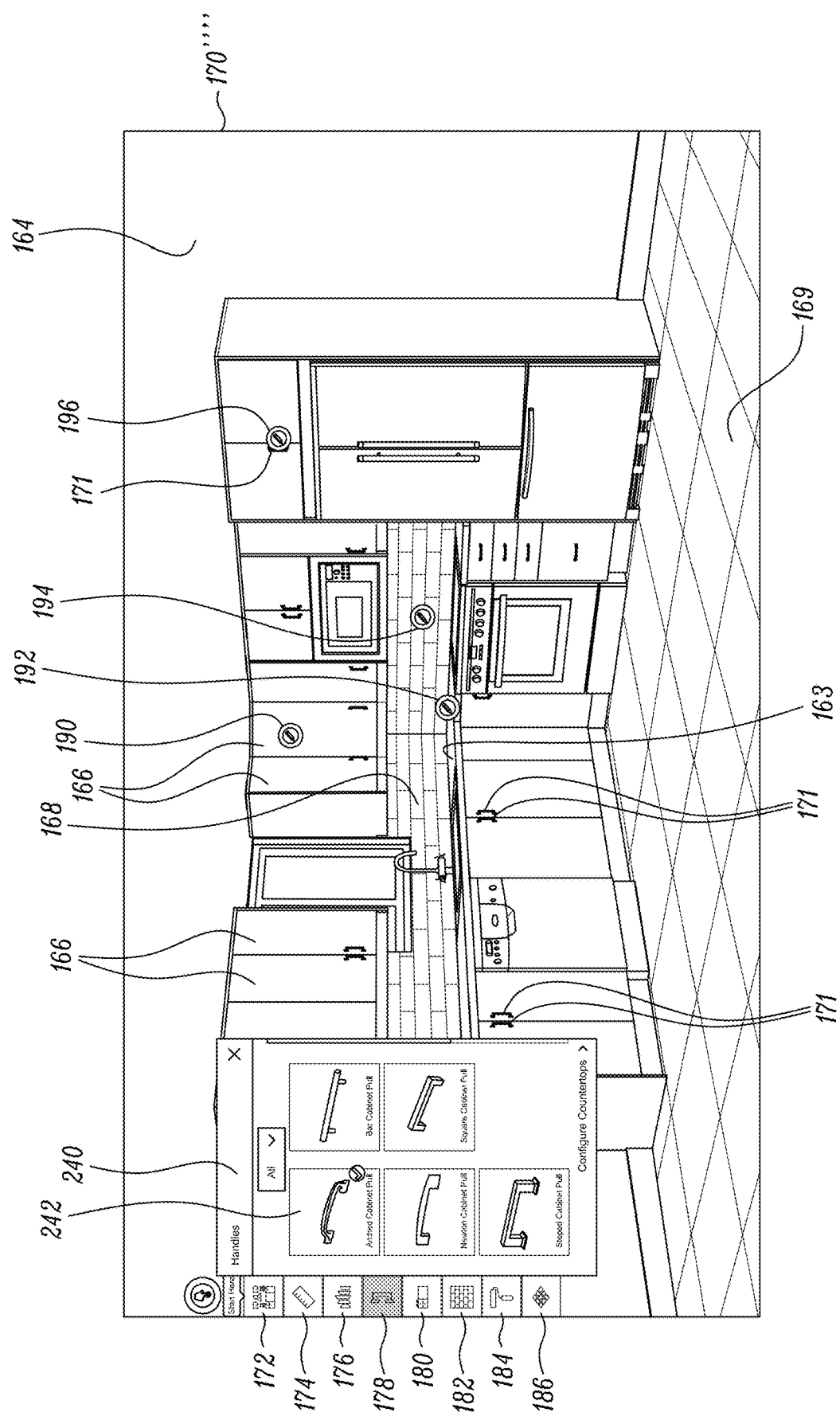

FIG. 9 illustrates the display when icon 178 is selected by the user. More specifically, FIG. 9 illustrates the visual display 170'''' generated (on high definition monitor 114 or on flat panel display 122) by the processor 112 in response to selection of icon 178. The visual display 170'''' displays a menu 240 displaying the kind of handles that can be present on the pivotable door 166. For example, FIG. 9 illustrates the door 166 has handle 242. However, the menu 240 provides as a mean to choose the handles on the door 166 (as desired by the user) from the various options displayed in the menu 240.

Figure 10:
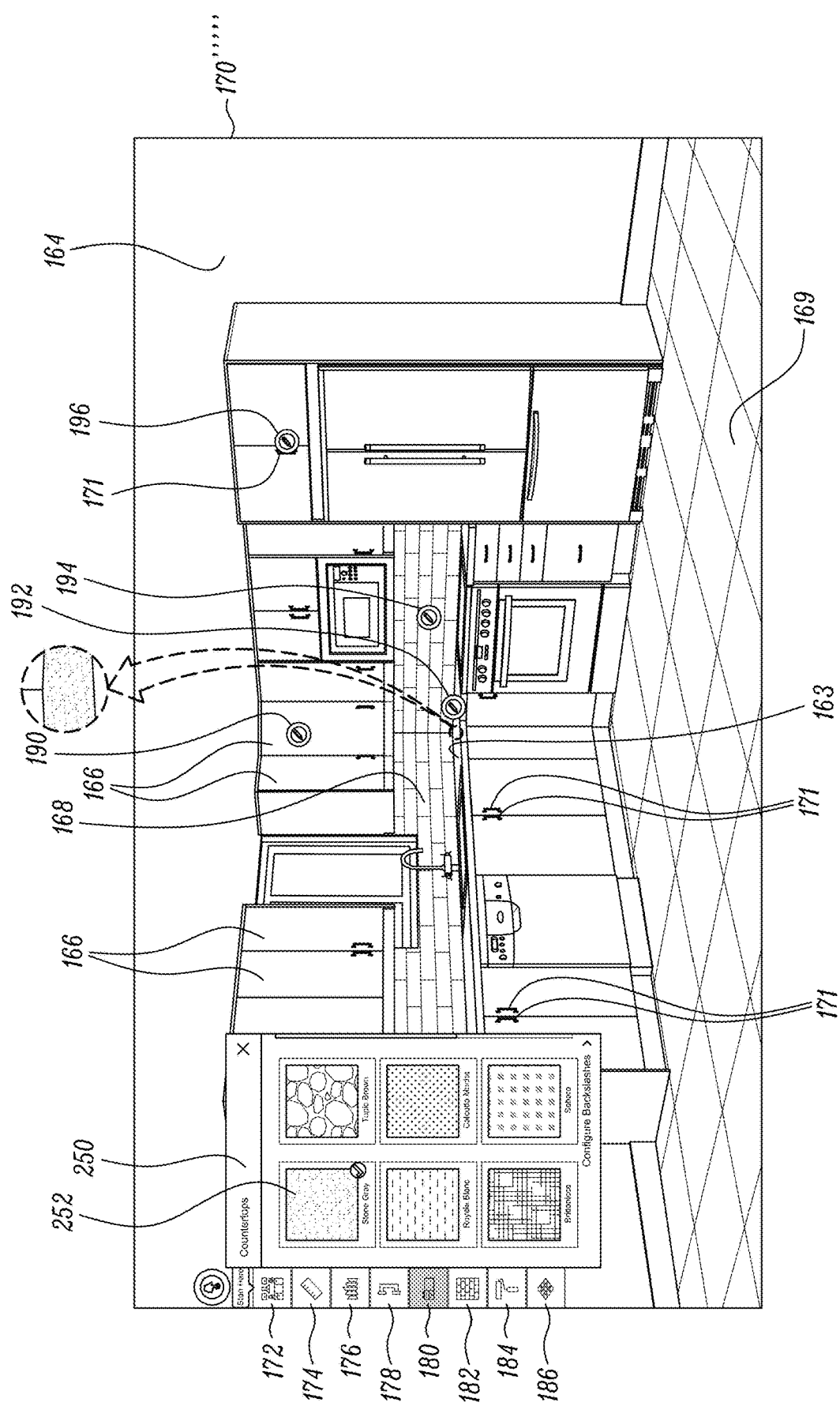

FIG. 10 illustrates the display (on high definition monitor 114 or on flat panel display 122) when icon 180 is selected by the user. More specifically, FIG. 10 illustrates the display 170''''' generated by the processor 112 in response to selection of icon 180. The display 170''''' displays a menu 250 displaying the kind of pattern that can be present on the countertops 163. For example, icon 252 of FIG. 10 illustrates the countertops 163's physical appearance. However, the menu 250 provides as a mean to edit the physical appearance of the countertops 163 (as desired by the user) by choosing from the options provided in the menu 250.

Figure 11:
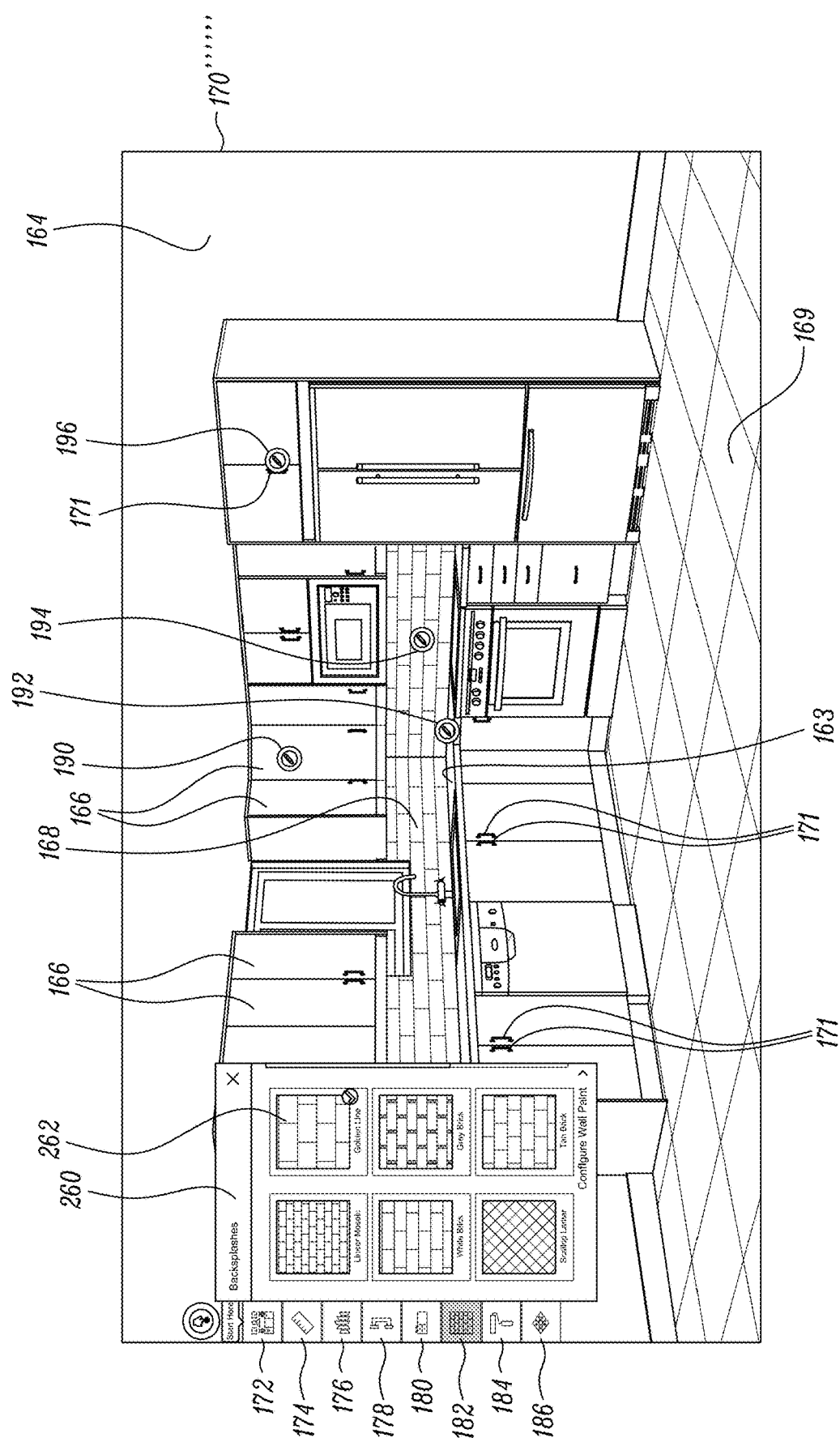

FIG. 11 illustrates the display (on high definition monitor 114 or on flat panel display 122) when icon 182 is selected by the user. More specifically, FIG. 11 illustrates the display 170'''''' generated by the processor 112 in response to selection of icon 180. The display 170'''''' displays a menu 260 displaying the kind of pattern that can be present on the wall tiles 168. For example, icon 262 of FIG. 11 illustrates the countertops 163's physical appearance. However, the menu 260 provides as a mean to edit the physical appearance of the wall tiles 168 (as desired by the user) by choosing an alternative pattern from the options provided in the menu 260.

Figure 12:
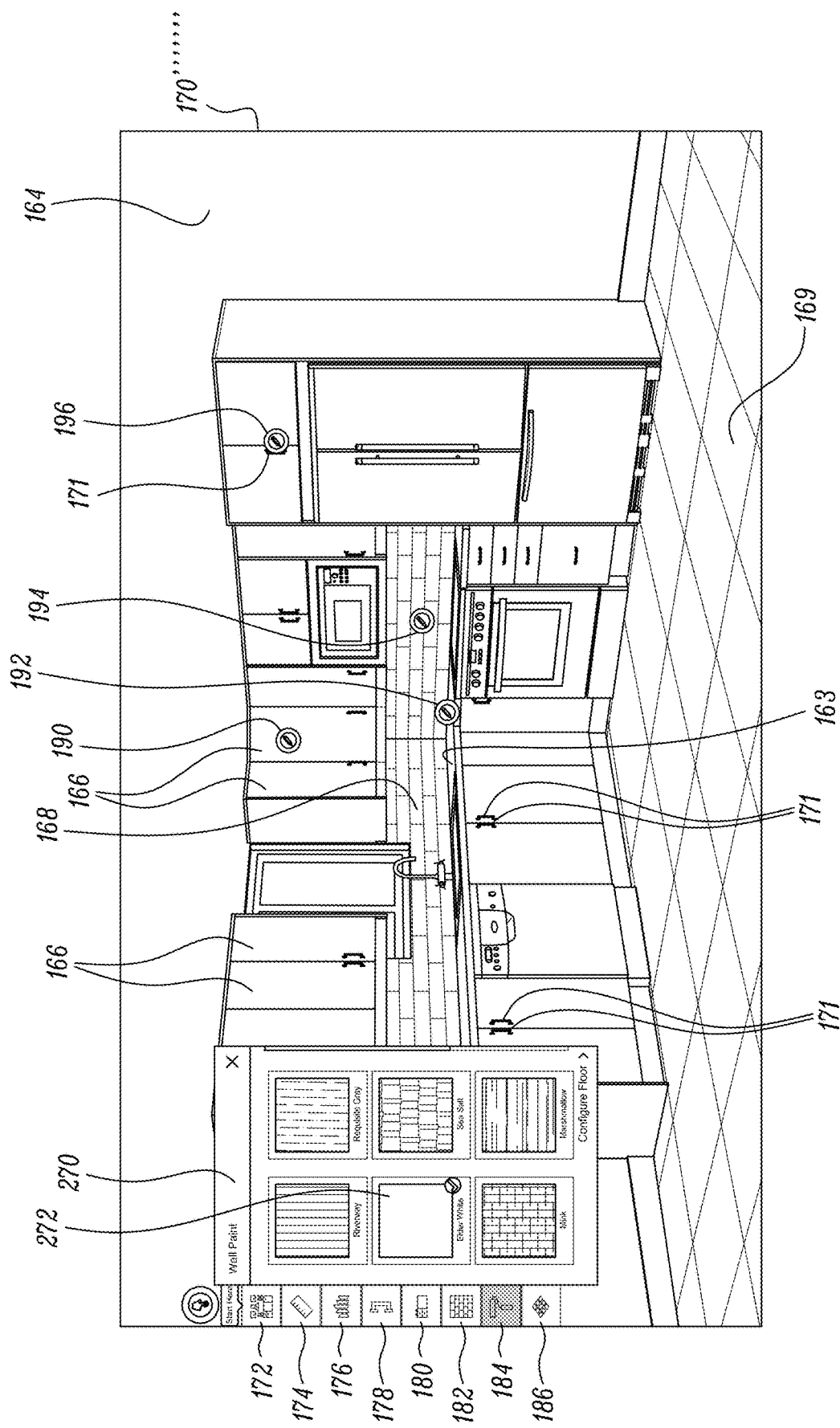

FIG. 12 illustrates the display (on high definition monitor 114 or on flat panel display 122) when icon 184 is selected by the user. More specifically, FIG. 12 illustrates the display 170''''''' generated by the processor 112 in response to selection of icon 184. The display 170''''''' displays a menu 270 displaying the paint pattern that can be present on the walls. For example, icon 272 of FIG. 12 illustrates the paint pattern on the walls. However, the menu 270 provides as a mean to edit the physical appearance of the paint pattern on the walls 164 (as desired by the user) by choosing an alternative pattern for the wall paint from the options provided in the menu 270.

Figure 13:
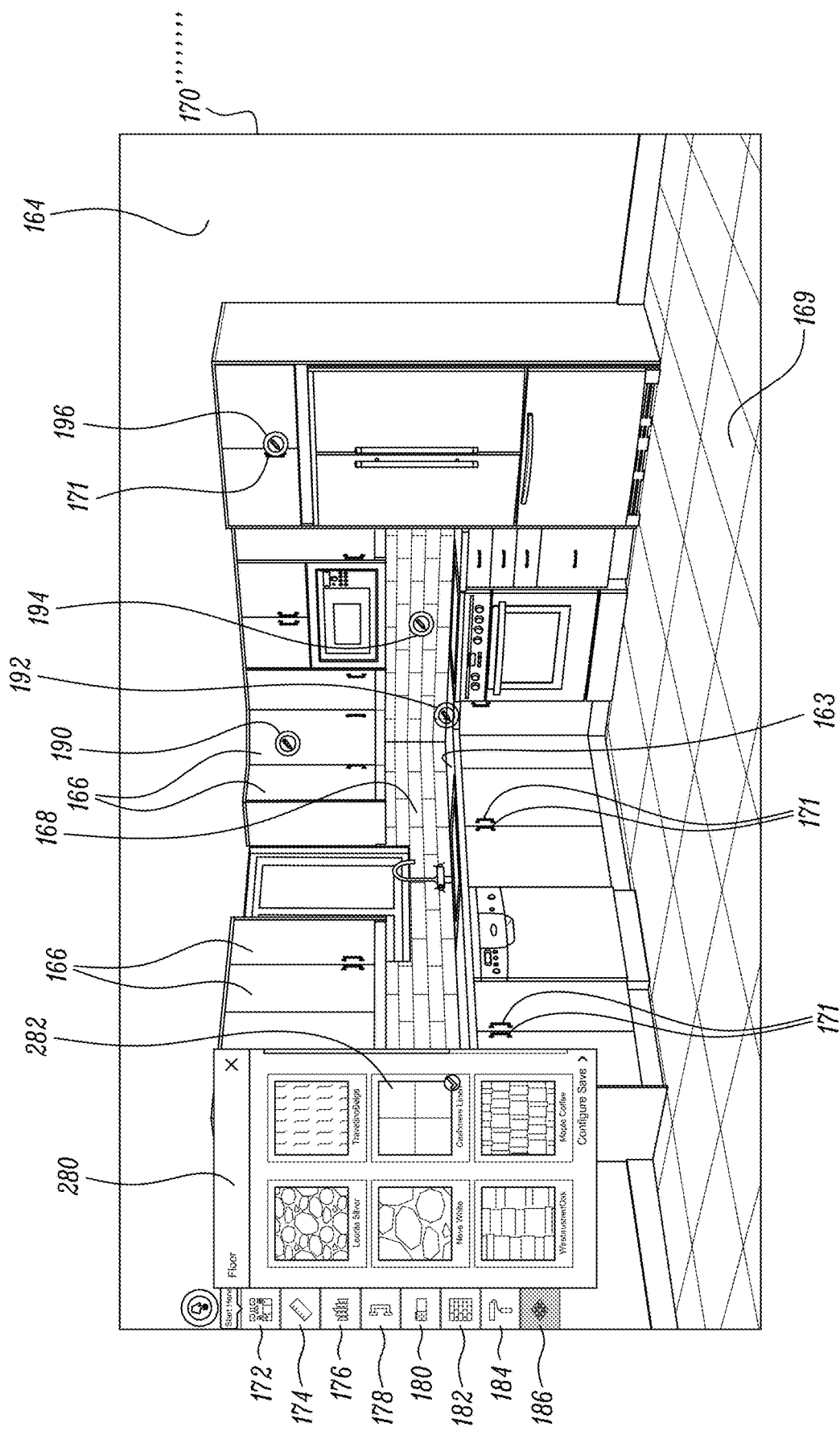

FIG. 13 illustrates the display when icon 186 is selected by the user. More specifically, FIG. 13 illustrates the display 170'''''''' generated by the processor 112 in response to selection of icon 186. The display 170'''''''' displays a menu 280 displaying the floor tiles that can be present on the flooring 169. For example, icon 282 of FIG. 13 illustrates the pattern on the flooring 169. However, the menu 280 provides as a mean to edit the physical appearance of the flooring 169 (as desired by the user) by choosing an alternative pattern for the flooring 169 from the options provided in the menu 270.

In the embodiment illustrated, the processor 112 may execute certain instructions pre-stored in the memory 110 to display the display 170 (as shown in FIG. 4) having dedicated customize icons 190, 192, 194 and 196 associated with cupboard 165 having pivotable doors 166, countertops 163, wall tiles 168 and handles 171, respectively (as shown in FIG. 4). In the embodiment illustrated, the customizable icon 190 is placed on one of the pre-installed doors 166 illustrated on the display 170. Similarly, the customizable icons 192, 194 and 196 are placed on the countertops 163, wall tiles 168 and handles 171, respectively. Selecting customizable icon from 190, 192, 194 and 196 allows the user to edit the material and appearance of the door 166, countertops 163, wall tiles 168 and handles 171. For example, FIG. 8, FIG. 10, FIG. 11 and FIG. 9 illustrate how a customizable menu opens up for editing the material and appearance of the door styles, countertops, backsplashes and handles when the customizable icon from 190, 192, 194 and 196, respectively, are selected.

In an aspect of the present disclosure, the interior designing system 100 may operate in an alternate manner More specifically, the interior designing system 100 may be configured for selecting and reviewing furnishings and fixtures for a room, and then visualizing the selected furnishings and fixtures in a room layout. In such implementations, the interior designing system 100 is configured to display a selected room layout and a plurality of objects that can be placed within the selected room layout. The interior designing system 100 is further configured to receive a selection of a first object, one or more positional parameters of the first object within the selected room layout. The interior designing system 100 is further configured to modify, based on user input, one or more design parameters of the first object. Furthermore, the interior designing system 100 is configured to render one or more of a photorealistic 3D or 2D view of the first object within the selected room layout.

Figure 14:
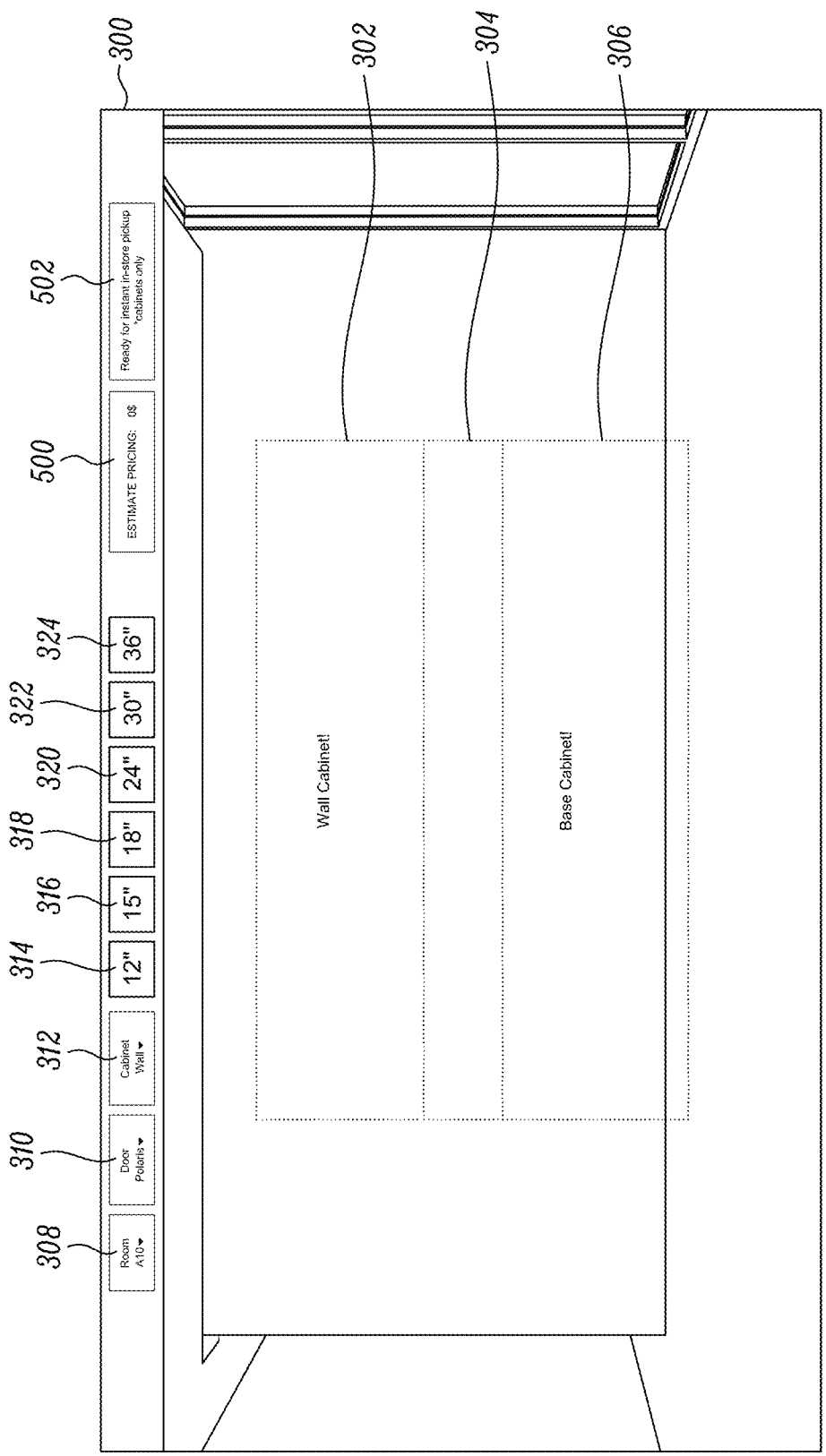
FIGS. 14-26 illustrate the steps for selecting and reviewing furnishings and fixtures for a room, and visualizing the selected furnishings and fixtures in a room layout, in accordance with an embodiment of the present disclosure.
Figure 15:
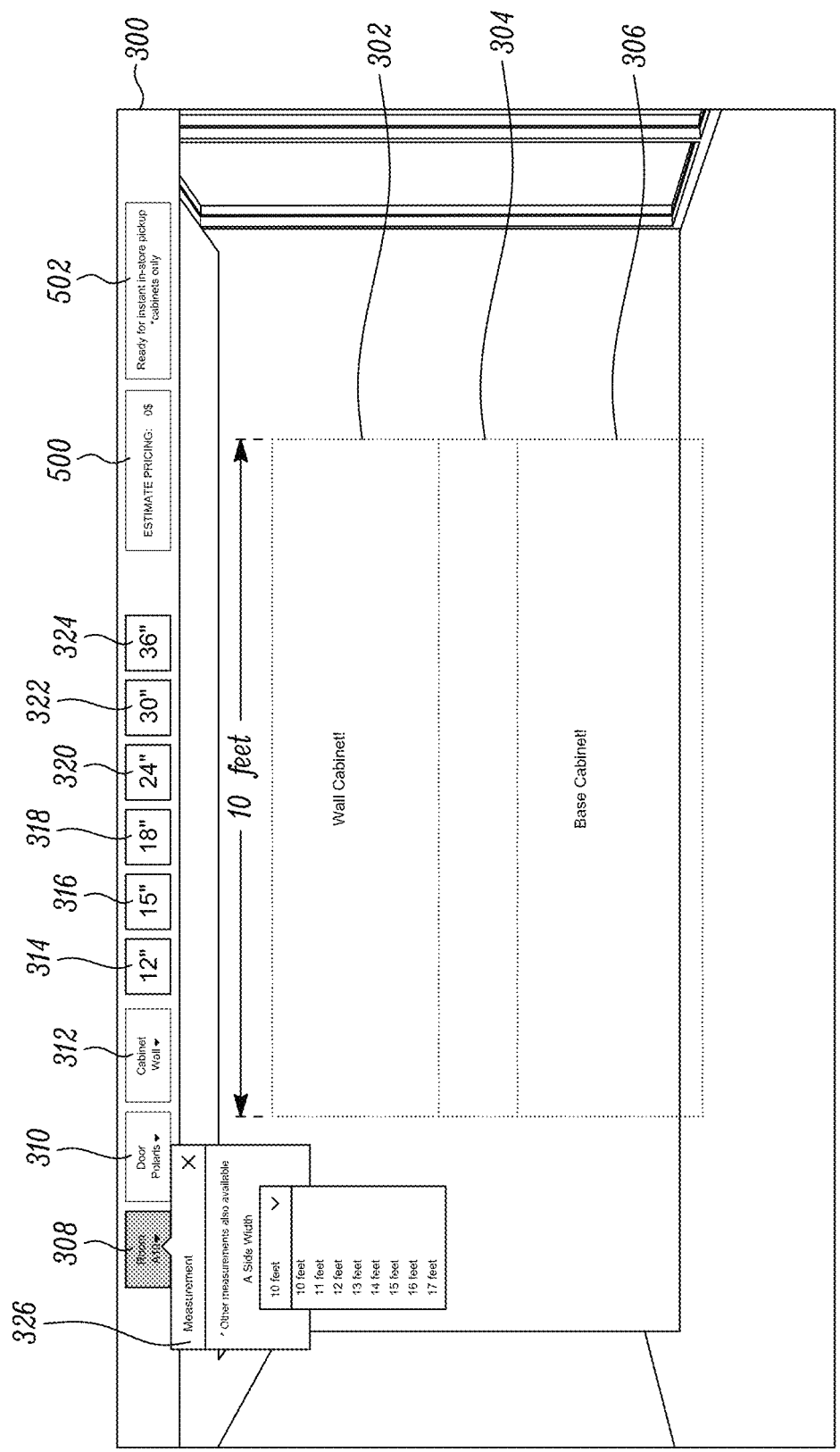

Such an implementation as disclosed above will now be explained in detail with reference to FIG. 13 to FIG. 25. The first step may be similar to as disclosed above i.e. as shown in FIG. 3, the startup screen 150 may be displayed on the display (i.e. on the high definition monitor 114 and flat panel display 122 as shown in FIG. 1 and FIG. 2), by the processor 112 (as shown in FIG. 1). The start-up screen 150 may illustrate room layouts in the form of icons (as shown at 152, 154, 156, 158, 160, 162). For the sake of better understanding of the foregoing disclosure, let us assume that the user selects the room layout 152 and this information is transmitted to the processor 112. Upon selection of the room layout 152, the processor 112 may execute certain instruction stored in the memory 110 to display a visual 300 (on the high definition monitor 114 or on flat panel display 122) having a room with the layout similar to room layout 152, as shown in FIG. 14. The visual 300 may be a 2D rendition of the room without any pre-placed or pre-installed objects therein. The visual 300 may have demarcated areas 302, 304 and 306. The areas 302, 304 and 306 may be configured to be manually designed by the user using a "drag and drop" feature.

Figure 16:
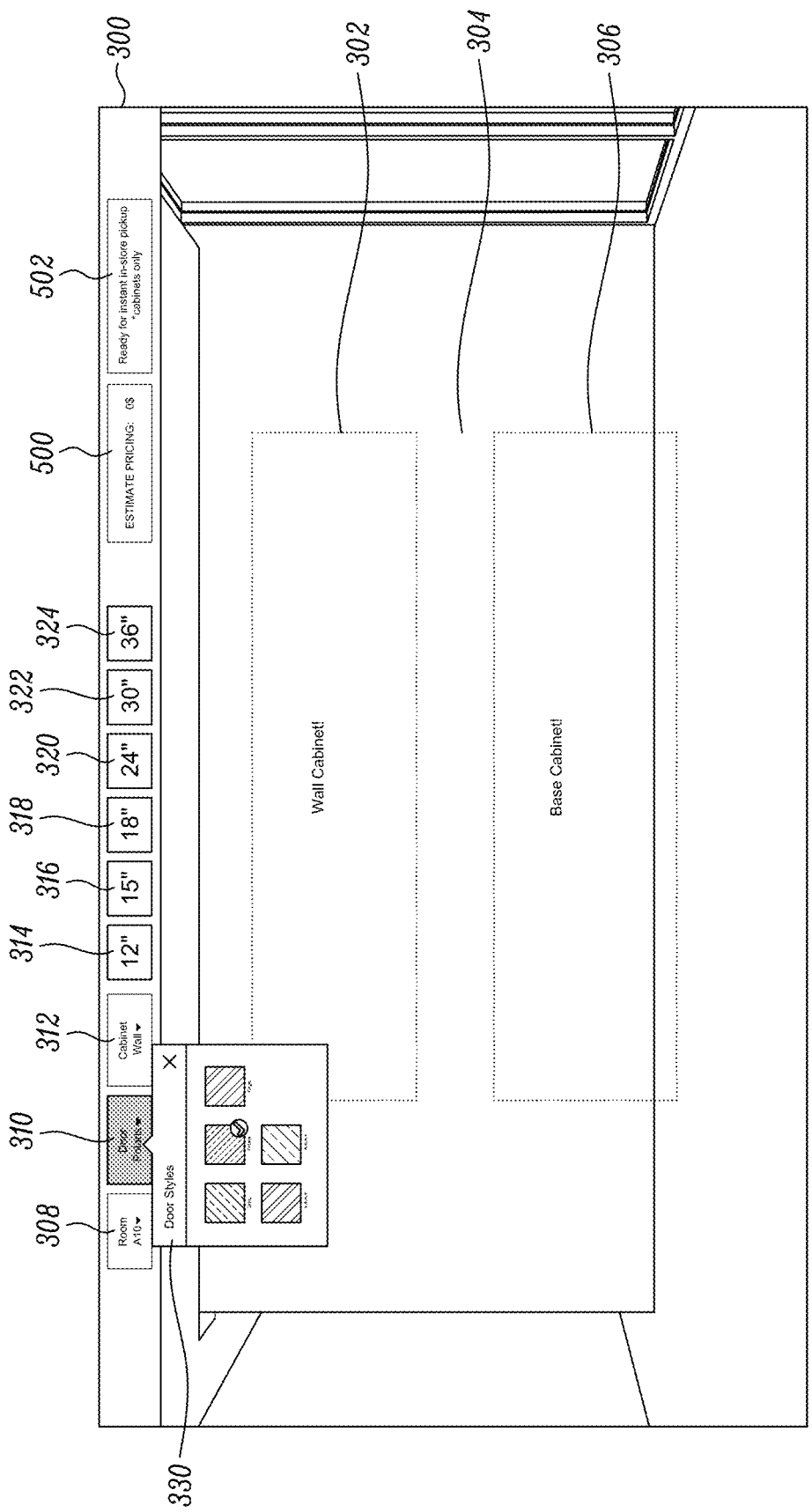
Figure 17:
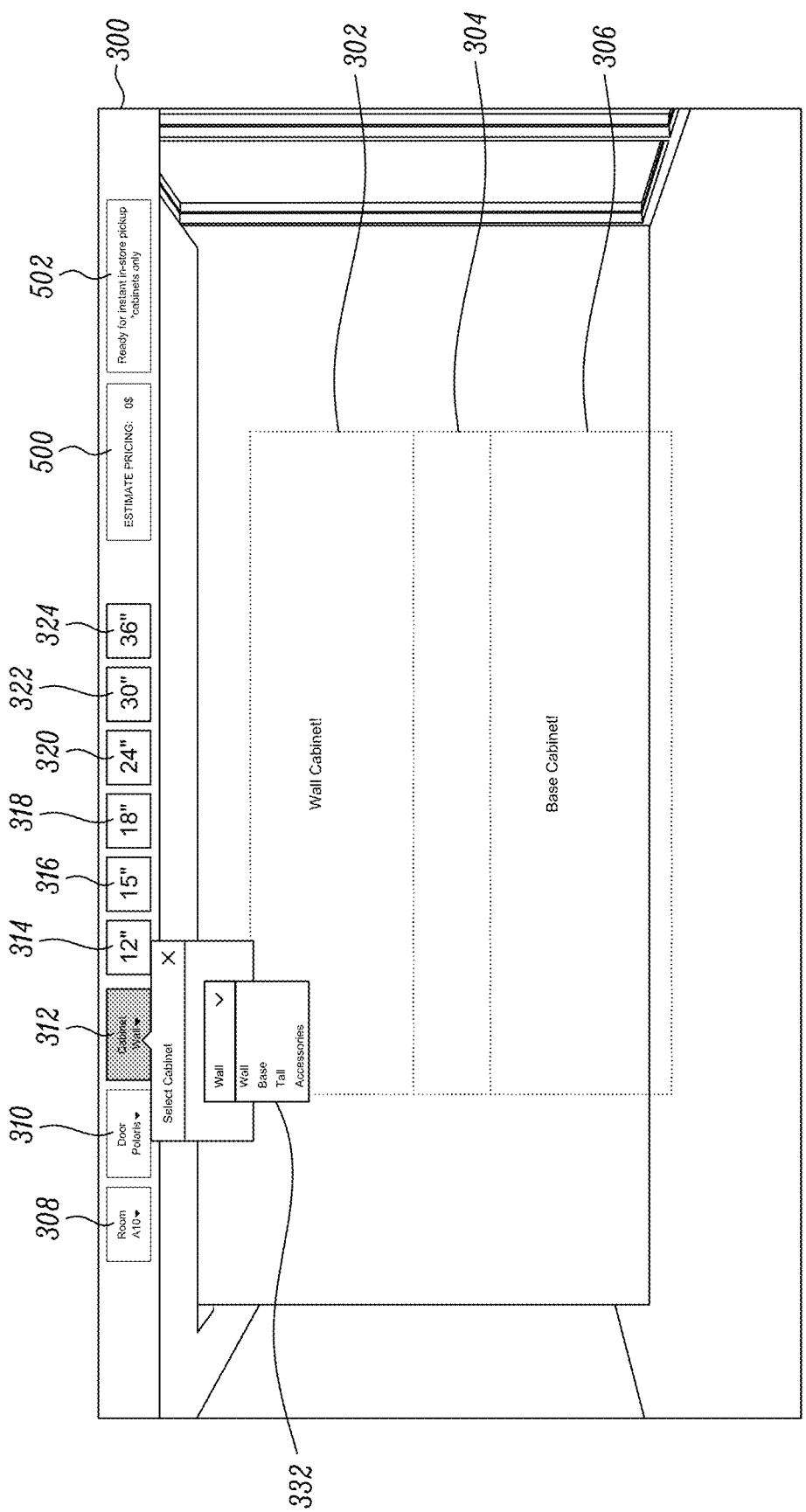
Figure 18:
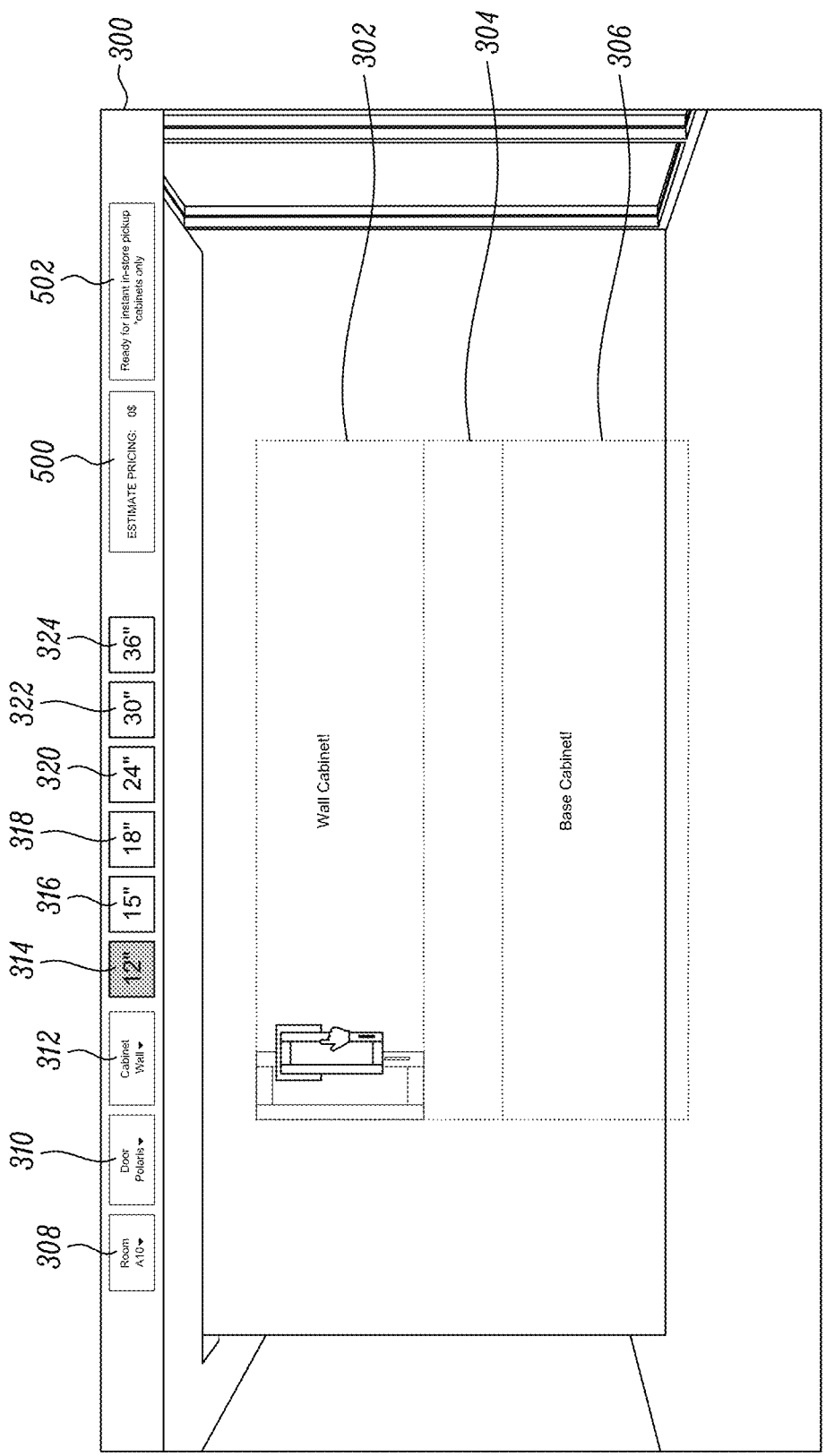

For example, the interior designing system 100 (i.e. processor 112 executes certain instructions stored in the memory 110) to display icons 308, 310, 312, 314, 316, 318, 320, 322 and 324 on the visual 300 for a selection of at least one object and placement of the at least one object in the areas 302, 304 and 306, by the user. For the sake of better understanding of the ongoing disclosure, the functionality of each of the icons 308, 310, 312, 314, 316, 318, 320, 322 and 324 displayed on the visual 300 will be explained. The icon 308 may be used by the user to edit the length of the areas 302, 304 and 306 in the visual 300. For example, in an embodiment, selection of the icon 308 may prompt the processor 112 to execute instructions in the memory 110 for opening a visual 300' where a submenu 326 (drop down list) is displayed. Using the submenu 326, the user may edit the length/width of the areas 302, 304 and 306. The icon 312 may be used by the user for selecting the type of object to be dragged and dropped by the user. For example, when the icon 312 is selected, the processor 112 may run certain computations/instructions stored in the memory 110 for displaying a drop-down list 332 as shown in FIG. 17. The drop-down list 332 provides the user with the ability to select a particular object and subsequently place the particular object in the areas 302, 304 and 306. For example, when the option "wall" is selected in the drop-down list 332 as shown in FIG. 16, the processor 112 executes a set of instructions stored in the memory 110 and displays the icons 314, 316, 318, 320, 322 and 324 are displayed.

The icon 314 may be associated with a wall cabinet of length 12 inches. The icon 316 may be associated with a wall cabinet of length 15 inches and so on. The user may select any of the icons 314, 316, 318, 320, 322 and 324 and then drag the selected icon in area 302, 304 and 306 via mouse 118 on display 114 or by dragging selected icon on touch screen 122 by hand or stylus. In this case, the processor 112 executes a set of instructions stored in the memory 110 to place the selected and dragged object (associated with the selected icon) in the area 302. Similarly, more such icons 314, 316, 318, 320, 322 and 324 may be selected and then dragged in area 302, 304 or 306. An exemplary customization of area 302 has been illustrated in FIG. 17, FIG. 18, FIG. 19 and FIG. 20. In such a manner, the processor 112 receives a selection of a plurality of objects, one or more positional parameters of each of the plurality of objects within the selected room layout.

Figure 19:
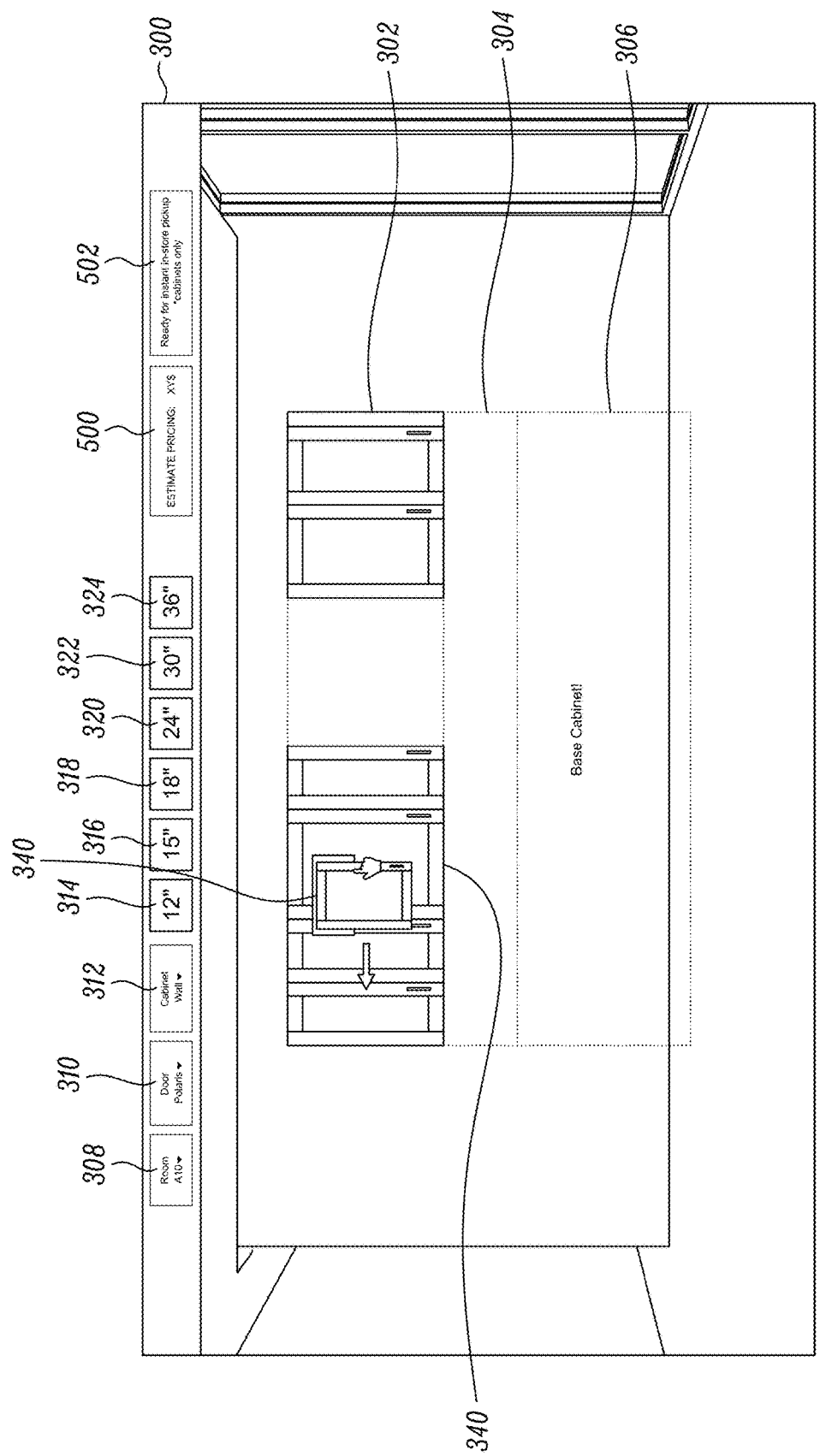
Figure 20:
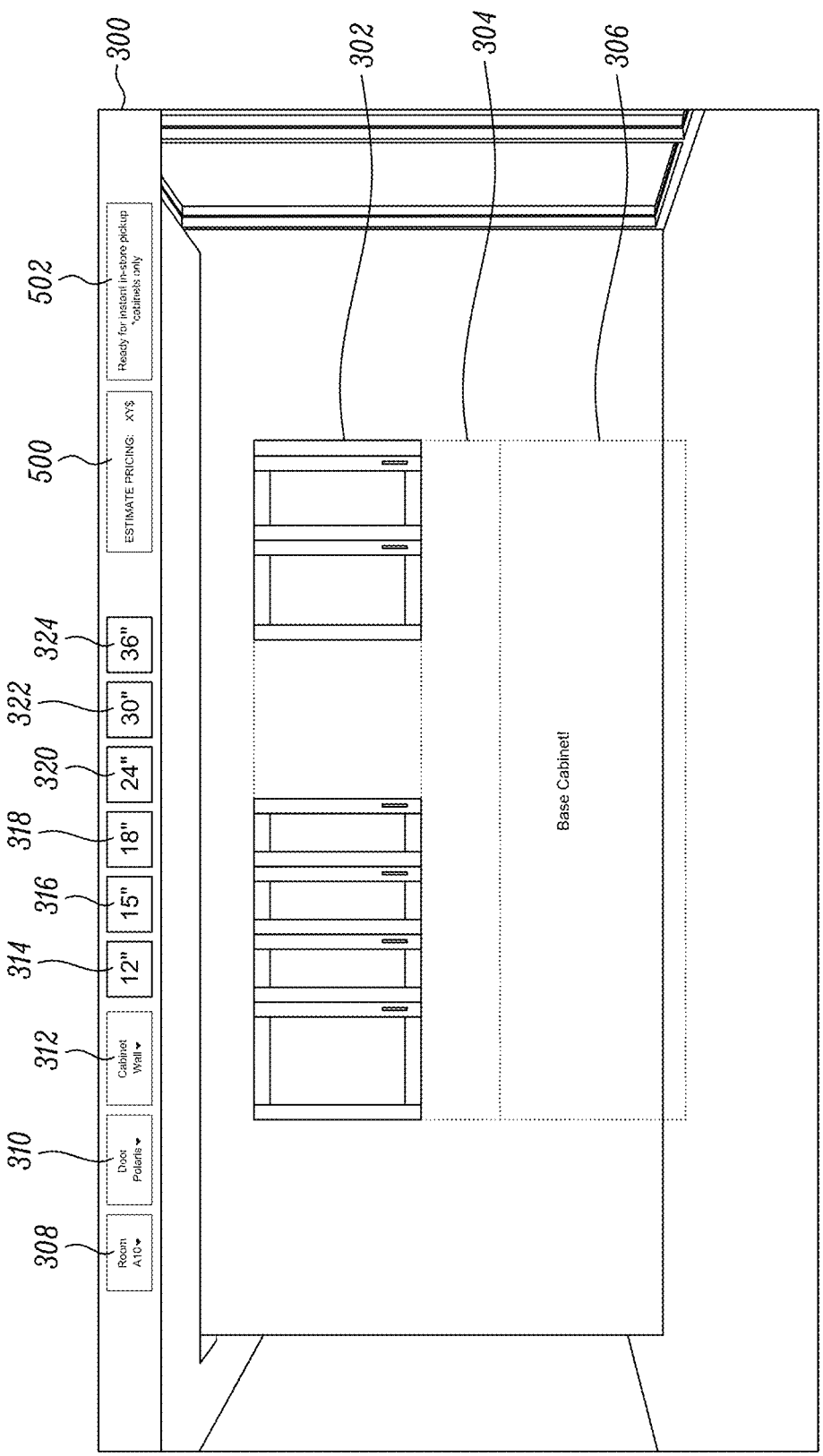
Figure 21:
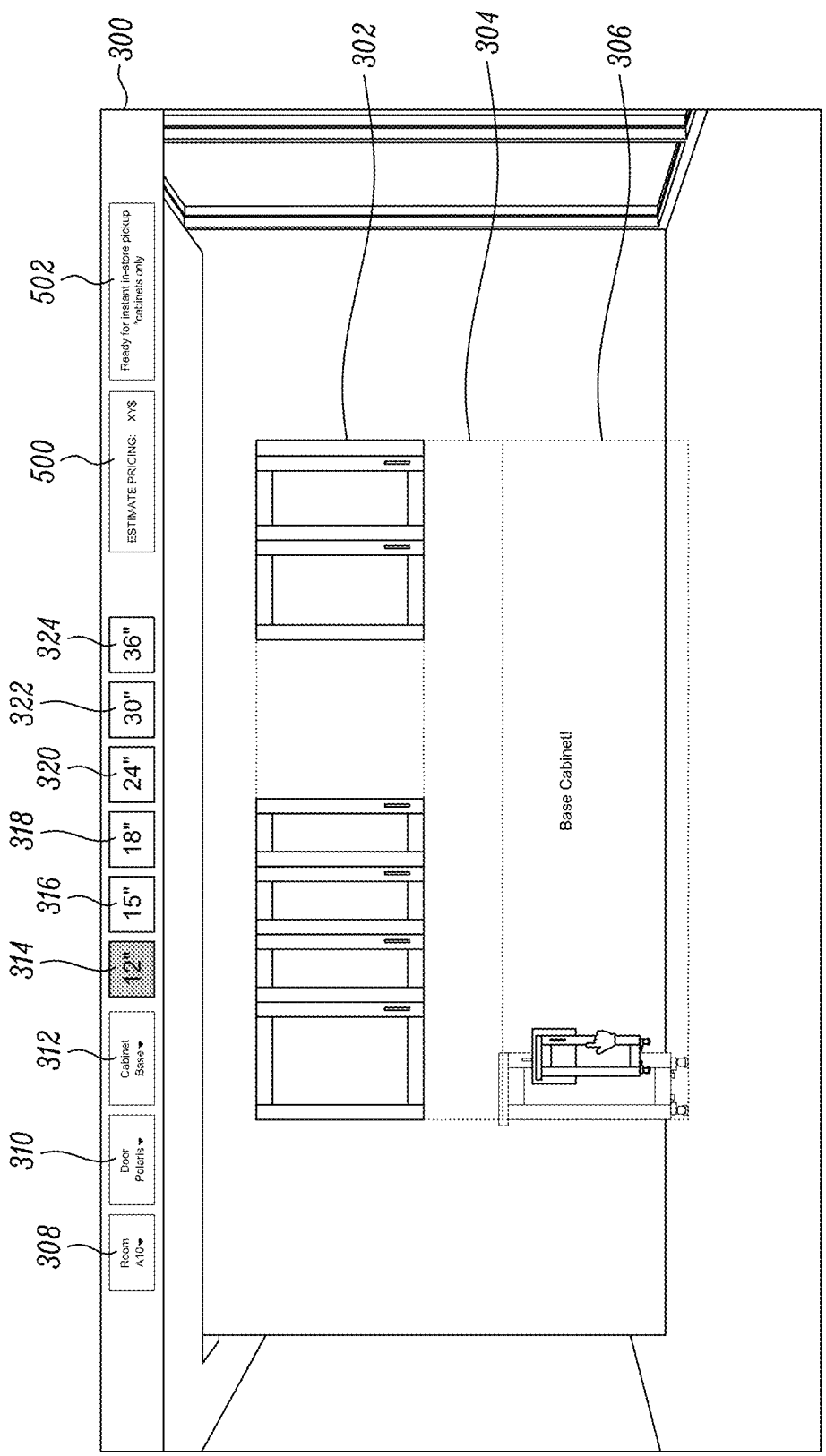

The user may also edit the position of each of the object installed in FIG. 19 using the interior designing system 100. For example, object 340 in FIG. 19 may be dragged to a different position in area 302 via mouse 118 on display 114 or by dragging selected icon on touch screen 122 by hand or stylus. The processor 112 executes a set of instructions stored in the memory 110 to place the selected and dragged object 340 to the different position in the area 302, as shown in FIG. 19 and FIG. 20.

Figure 22:
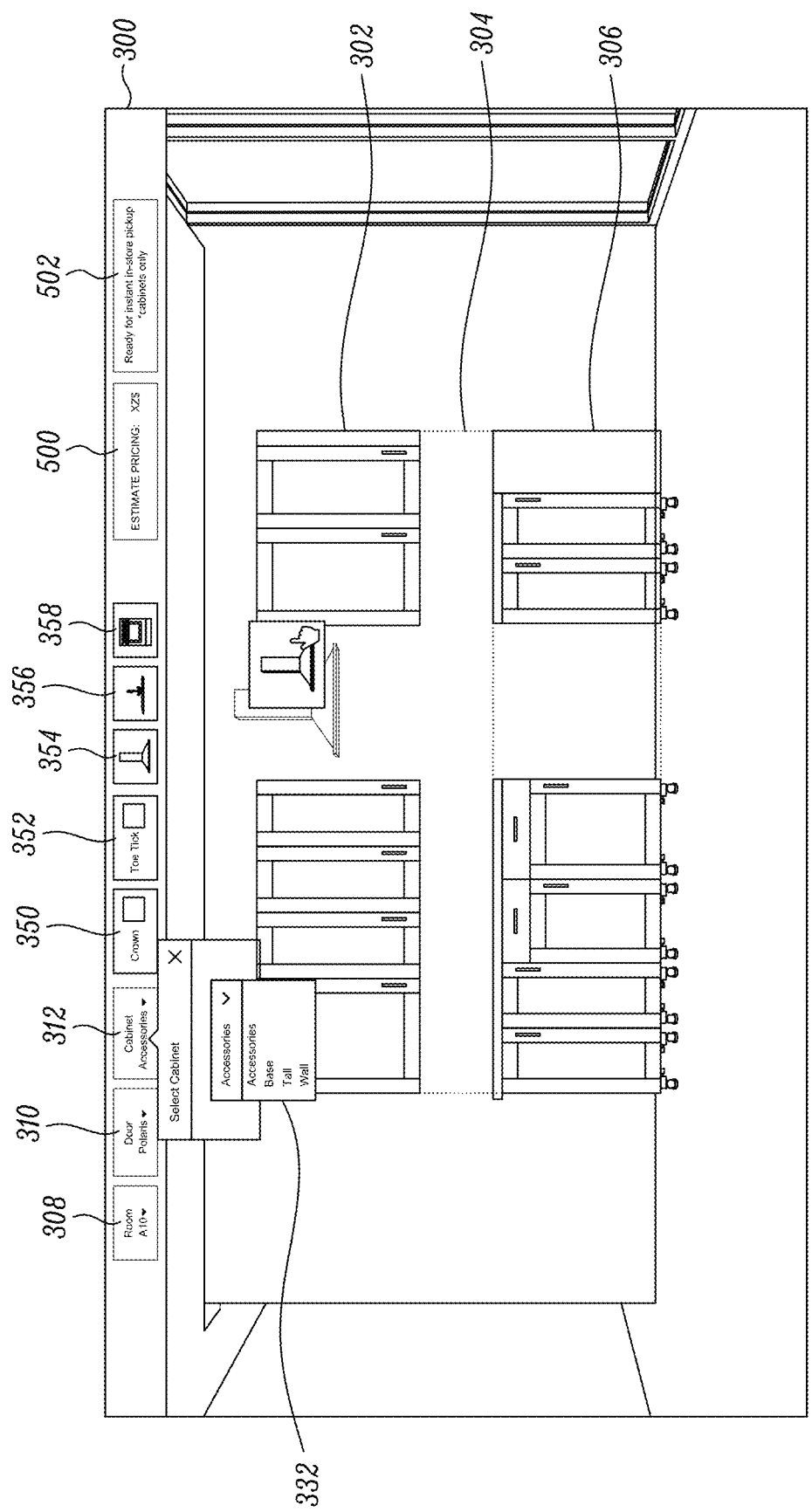
Figure 23:
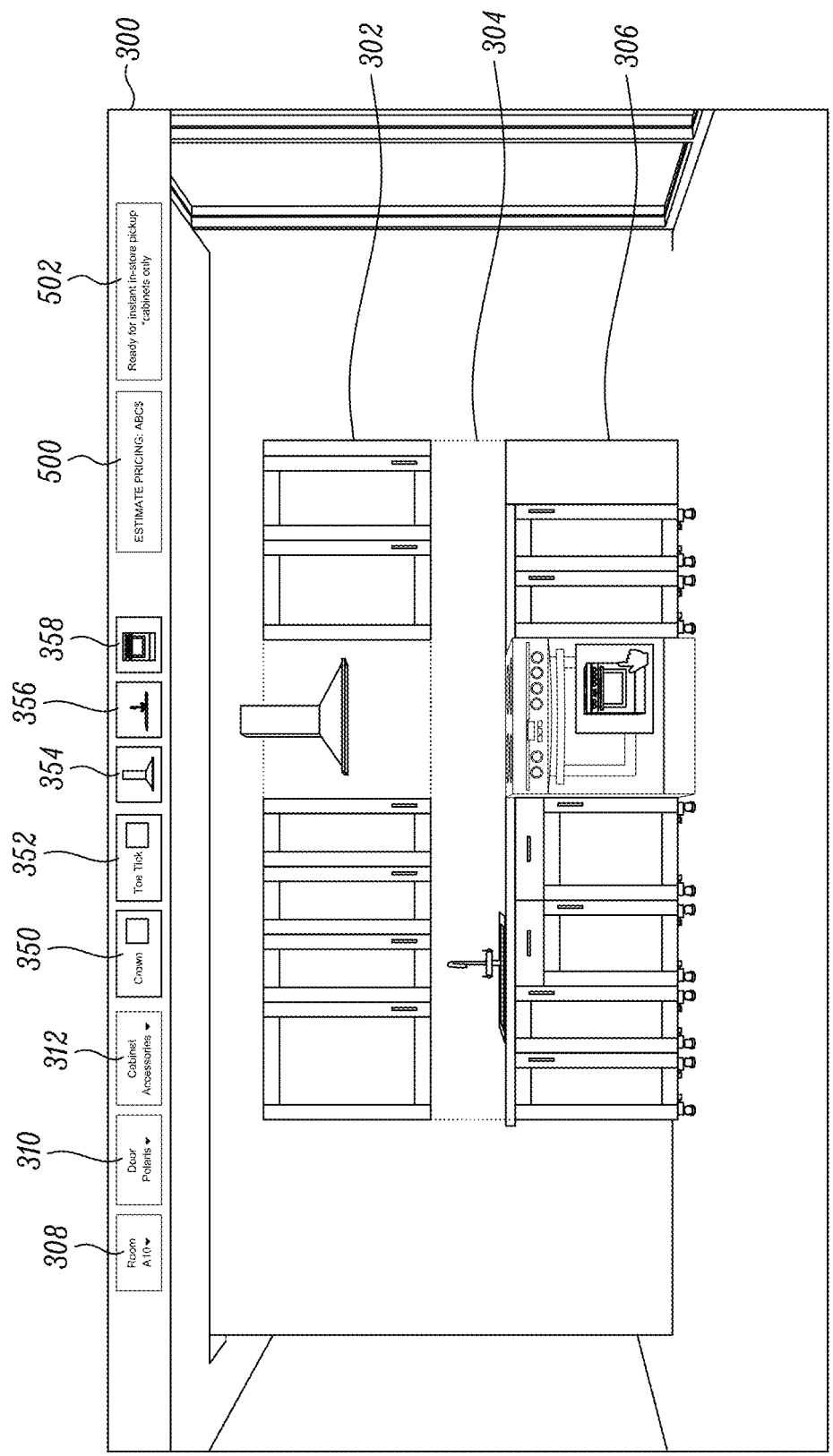

The user may now select option "base" in menu 332 and customize area 304 in a similar manner. The user may now want to add accessories to the room layout. Accordingly, the user may select "accessories" in menu 332. In response to selection of "accessories" in menu 332, the processor 112 executes a set of instructions stored in the memory 110 and modifies the display to display visuals 300" and icons 350, 352, 354, 356 and 358. In the exemplary embodiment illustrated, the icon 350 may be for "CROWN", the icon 352 may be for "Toe Tick", the icon 354 may be for placing the exhaust system (chimney), the icon 356 may be for placing the kitchen sink and icon 358 may be for placing an oven/cooking equipment. Selection of icons 350 and 352 instructs the processor 112 to install the Crown 370 and Toe Tick 380 to the base cabinets and wall cabinets, as can be seen on a comparison between FIG. 23 and FIG. 24. On the other hand, dragging and dropping icons 354, 356 and 358 to specific positions in the areas 302, 304 and 306 installs objects such as exhaust system, kitchen sink and cooking equipment to the room layout, as can be seen in FIG. 22 and FIG. 23.

Figure 25:
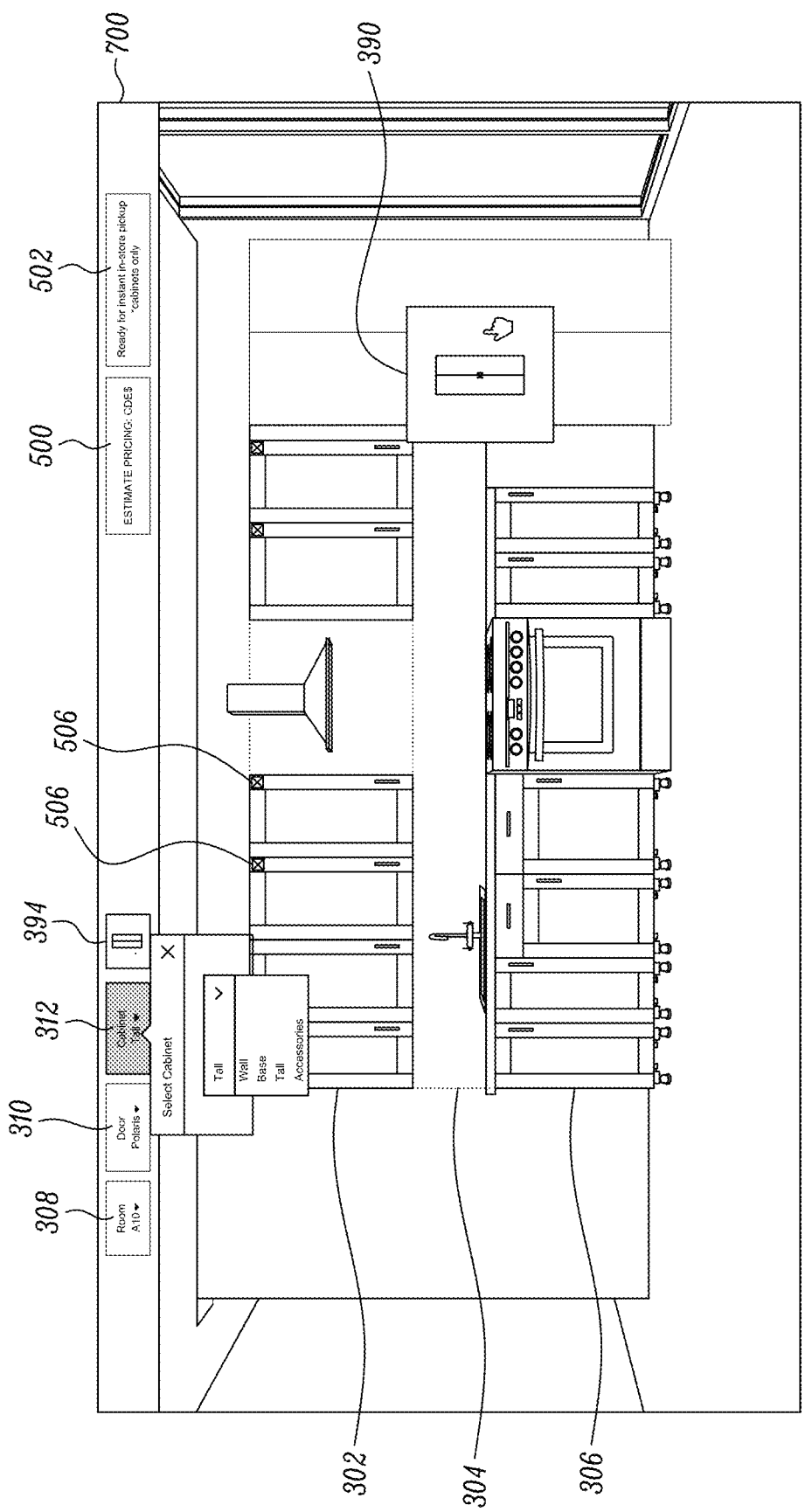
Figure 26:
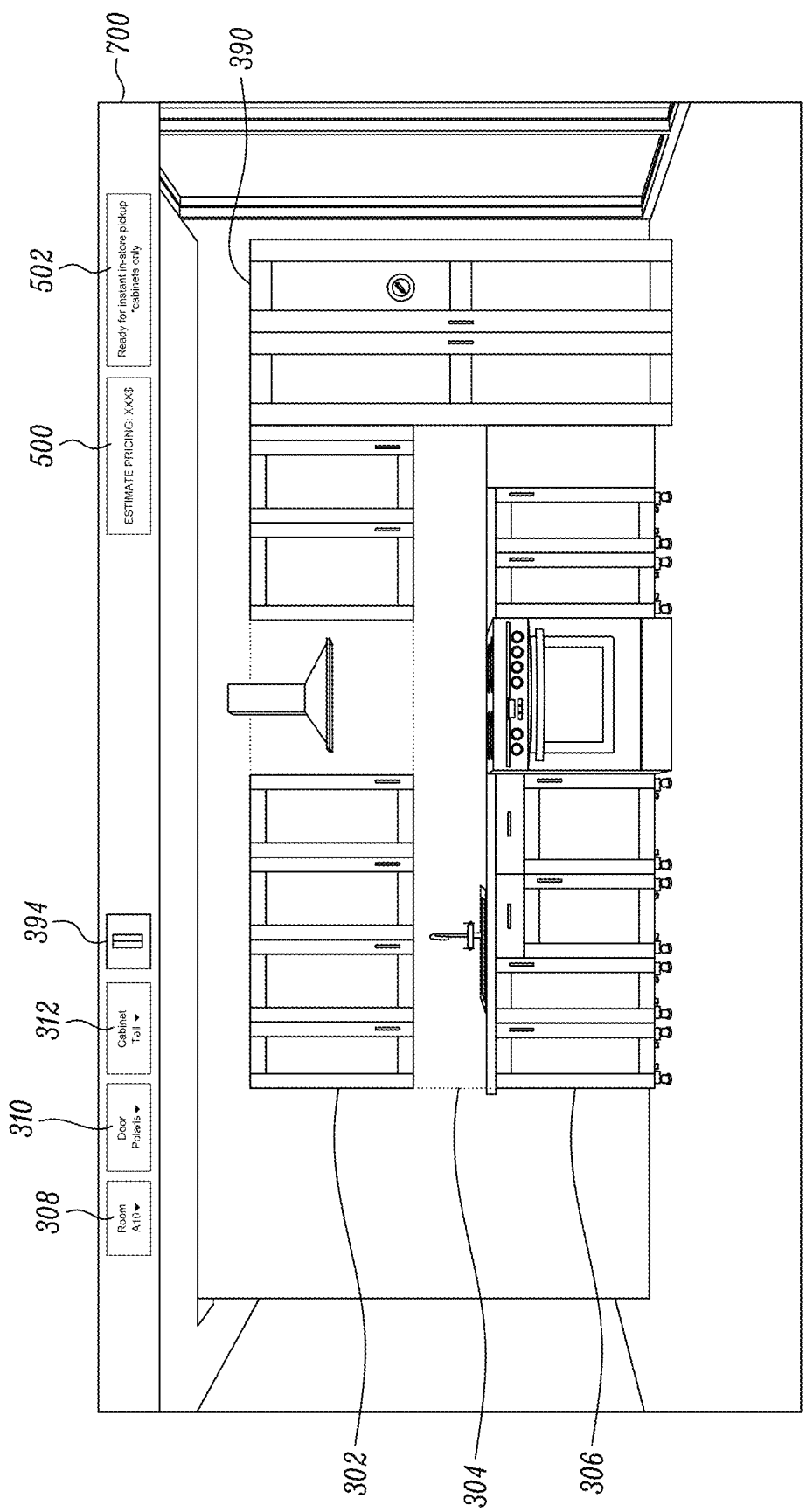

In an embodiment, the interior designing system 100 may also provide for visualizing a tall cupboard within the selected room layout. The user may select the option 'tall' from the drop-down list 332, as shown in FIG. 25 and FIG. 26. Upon receipt of this information, the processor 112 may execute instructions stored in the memory 110 to display an icon 394. Selecting and dragging the icon 394 using the mouse 118 or using the touch screen 122, a tall cabinet cupboard 390 may be visualized in the selected room layout.

After the user has customized the selected room layout, the interior designing system 100 renders a final photorealistic 3D or 2D view of the plurality of objects placed within the selected room layout. For the sake of brevity, let us assume that FIG. 26 is the final rendition of the room by the user.

INDUSTRIAL APPLICABILITY

Figure 27:
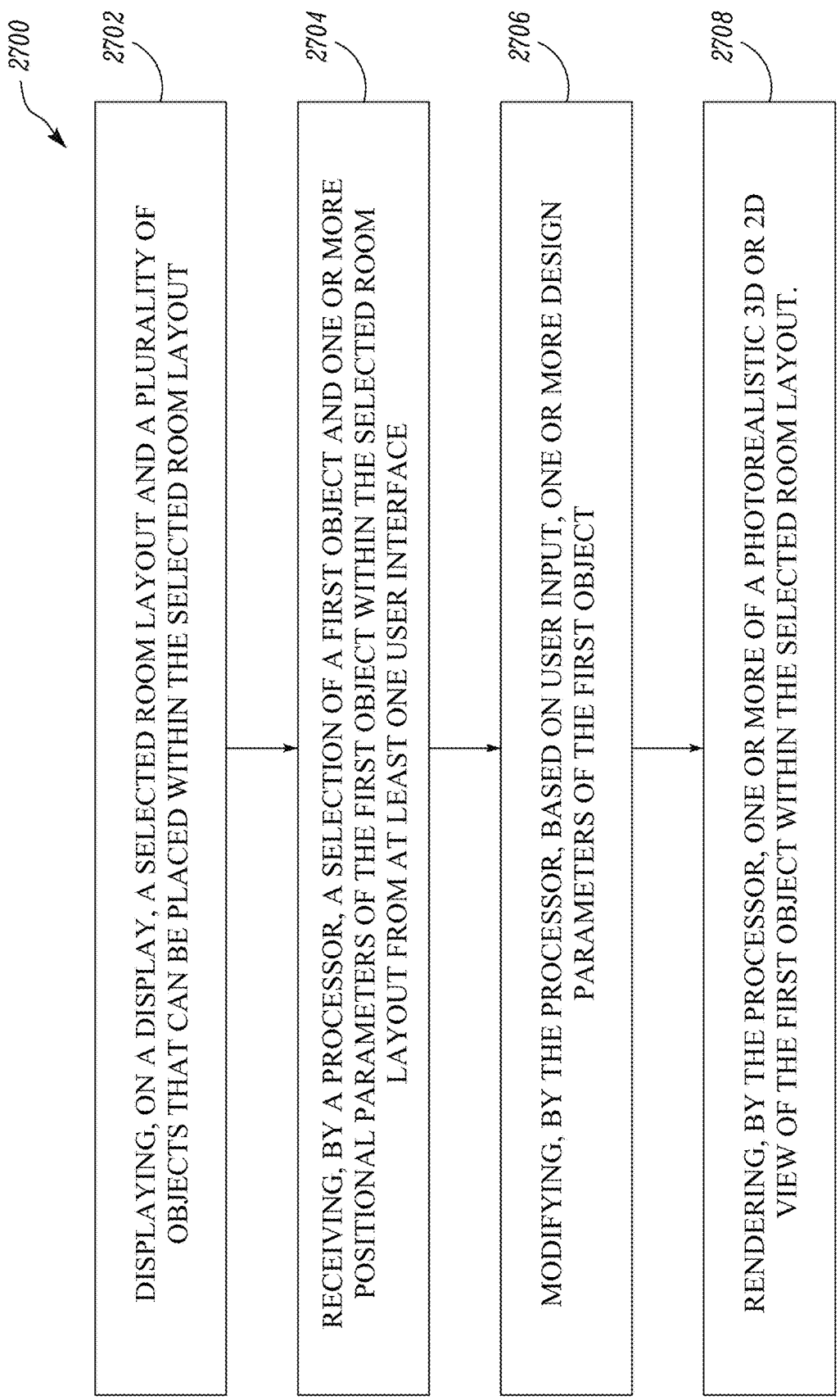
FIG. 27 depicts a method for selecting and reviewing furnishings and fixtures for a room and visualizing the selected furnishings and fixtures in a room layout, in accordance with an embodiment of the present disclosure.

Following is a description of a process/method 2700 (as shown in FIG. 27) by which the virtual content corresponding to the photorealistic, visualize-in-room rendering is created by the disclosed interior designing system 100. For the purpose of understanding of the method 2700, kitchen layouts are used as the basis for the following explanation in the illustrations. However, it will be appreciated that the method may be repeated/multiplied for each of the number of room layouts offered to the user where the room layout may be for a bedroom, drawing room, lobby, bathroom or the like.

The method 2700 begins by displaying a plurality of room layouts on the display (i.e. on the high definition monitor 114 and flat panel display 122 as shown in FIG. 1 and FIG. 2) i.e. the processor 112 executes the set of instructions stored in the memory 110 to display room layouts 152, 154, 156, 158, 160 and 162 on the display (i.e. on the high definition monitor 114 or on flat panel display 122). The user subsequently is prompted to select a specific room layout. Upon receiving information that a selection of a specific room layout via icons 152, 154, 156, 158, 160 and 162 has been made, the processor 112 executes a set of instructions stored in the memory 110 to display an enlarged view of the selected room layout and a plurality of objects (in the form of a plurality of menus and icons to be placed/installed in the selected room layout) i.e. STEP 2702 takes place.

Let us assume that in an exemplary scenario a user selects room layout 152. Upon selection of the room layout 152, the processor 112 may execute certain instruction stored in the memory 110 to display the visual depiction 300 having a room with the layout similar to room layout 152. The areas 302, 304 and 306 displayed on the visual depiction 300 may be configured to be manually designed by the user using a "drag and drop" feature. For example, the interior designing system 100 (i.e. processor 112 executes certain instructions stored in the memory 110) to display icons 308, 310, 312, 314, 316, 318, 320, 322 and 324 on the visual depiction 300 for a selection of at least one object and placement of the at least one object in the areas 302, 304 and 306.

As discussed above, the icon 308 may be used by the user to edit the length of the areas 302, 304 and 306 in the visual depiction 300. For example, in an embodiment, selection of the icon 308 may prompt the processor 112 to execute instructions in the memory 110 for opening a visual depiction 300' where a submenu 326 (drop down list) is displayed. Using the submenu 326, the user may edit the length/width of the areas 302, 304 and 306. The icon 312 may be used by the user for selecting the type of object to be dragged and dropped by the user. For example, when the icon 312 is selected, the processor 112 may run certain computations/instructions stored in the memory 110 for displaying a drop-down list 332 as shown in FIG. 17. The drop-down list 332 provides the user with the ability to select a particular object and subsequently place the particular object in the areas 302, 304 and 306. For example, when the option "wall" is selected in the drop-down list 332 as shown in FIG. 17, the processor 112 executes a set of instructions stored in the memory 110 and displays the icons 314, 316, 318, 320, 322 and 324 are displayed.

The icon 314 may be associated with a wall cabinet of length 12 inches. The icon 316 may be associated with a wall cabinet of length 15 inches and so on. The user may select any of the icons 314, 316, 318, 320, 322 and 324 and then drag the selected icon in area 302, 304 and 306 via mouse 118 on display 114 or by dragging selected icon on touch screen 122 by hand or stylus. In this case, the processor 112 executes a set of instructions stored in the memory 110 to place the selected and dragged object (associated with the selected icon) in the area 302. Similarly, more such icons 314, 316, 318, 320, 322 and 324 may be selected and then dragged in area 302, 304 or 306. An exemplary customization of area 302 has been illustrated in FIG. 17, FIG. 18, FIG. 19 and FIG. 20. In such a manner, the processor 112 receives a selection of a plurality of objects, one or more positional parameters of each of the plurality of objects within the selected room layout (STEP 2704).

Figure 24:
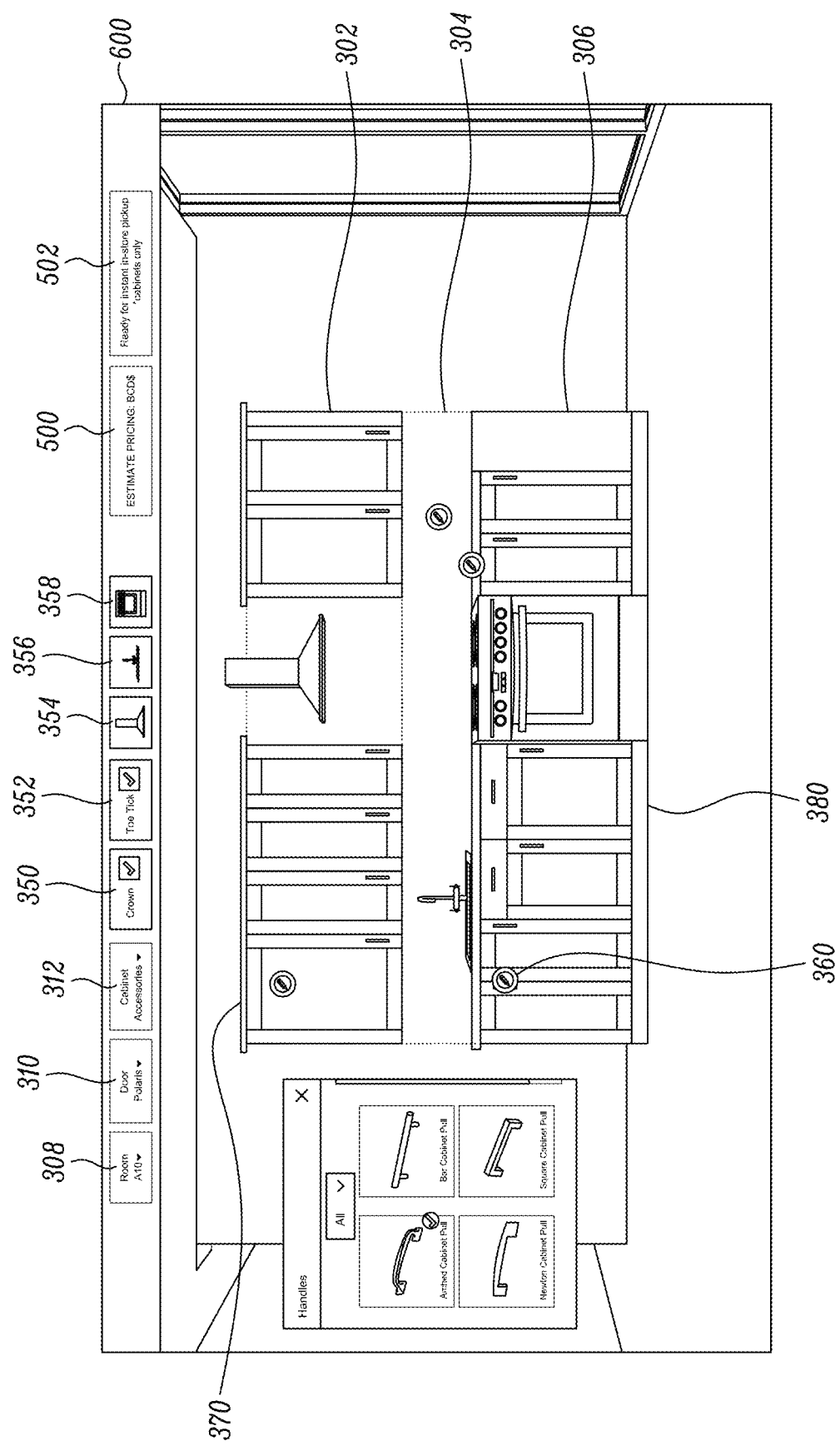

Subsequently, the user may edit one or more design parameters associated with the plurality of objects placed in the selected room layout. The design parameters include a material of the first object, a sizing of the first object, a shape of the first object, outer structure of the first object and the inner structure of the first object. For example, the user may select icon 310, generated by the processor 112, on visual depiction 300. Upon receipt of the information that the selection of the icon 310 has been performed by the user, the processor 112 generates a menu 330 (as shown in FIG. 16). The menu 330 allows the user to choose the exterior look for the door from the plurality of options displayed in the menu 330. In a similar manner, the user may select icon 360, generated by the processor 112, on visual depiction 300, as shown in FIG. 24. Selection of the icon 360 may allow the user to edit the handles to be present on the doors. More specifically, upon receipt of the information that the selection of the icon 360 has been performed by the user, the processor 112 generates a menu. The menu allows the user to choose the type of handle for the door from the plurality of options displayed in the menu (STEP 2706).

After the user has customized the selected room layout, the interior designing system 100 renders a final photorealistic 3D or 2D view of the plurality of objects placed within the selected room layout, as shown in FIG. 26 (STEP 2708).

In an aspect of the present disclosure, the interior designing system 100 and the method 2700 may be configured to compute the cost of manufacturing the plurality of objects as depicted in the photorealistic 3D or 2D view. The processor 112 and the memory 110 may have suitable logic and instructions that when executed can compute the cost of manufacturing the plurality of objects as depicted in the photorealistic 3D or 2D view. An icon 500 may be configured to display the result of the computation (i.e. cost for manufacturing the plurality of objects as depicted in the photorealistic 3D or 2D view). The icon 500 may be a dynamic icon and may be configured to update the cost at each step of the method 2700 (as can be seen from a comparison between FIG. 14 and FIG. 26).

In an aspect of the present disclosure, the processor 112 is configured to compute the cost of transporting first object and the one or more objects to a home site, and the cost of assembling and installing the manufactured first object and the one or more objects at the home site. More specifically, the processor 112 and the memory 110 may have suitable logic and instructions that when executed can compute the cost of transporting first object and the one or more objects to a home site, and the cost of assembling and installing the manufactured first object and the one or more objects at the home site.

In an aspect of the present disclosure, the processor 112 and the memory 110 may have suitable logic and instructions that when executed can delete one or more of the first object and the one or more objects from the photorealistic 3D or 2D renditions as desired by the user. For example, while adding objects to the selected room layout, the processor 112 displays a delete icon 506 for each object, as shown in FIG. 25. Upon receiving the information that the user has selected the icon 506, the processor 112 deletes the one or more of the plurality of objects, as desired by the user, from the photorealistic 3D or 2D renditions.

In an aspect of the present disclosure, the interior designing system 100 may be a kiosk in a supermarket. The processor 112 and the memory 110 may have suitable logic and instructions that when executed can provide information to the user to locate the plurality of objects depicted in the 2D and 3D renditions at a specific location (or aisle) in the supermarket (hardware shop). An icon 500, generated by the processor 112 on the display, may be configured to display the exact location (or aisle) of the plurality of objects in the 2D and 3D renditions in the supermarket (hardware shop).

Thus, the method creates, two-dimensional digital renditions of the room design (such as floor plans, wall elevations, profiles and cabinet placement), and three-dimensional digital renditions of each product offered (such as cabinets, appliances, and hardware), color/material offerings relating to each product (in the form of physical samples and/or digital representations) for all surfaces (cabinets, walls, floors, backsplash, stains, glazes), and other interior design direction for accessorizing/merchandizing the kitchen. This information is utilized to build high detail three-dimensional digital representations of the kitchen, hardware, accessories, appliances, fixtures, etc. At the same time as the kitchen is being "3D modeled", all color/materials are being created into seamless textures for all surfaces within the kitchen.

Once the kitchen is modeled as described above, every surface is assigned "rules" pertaining to direction, scale, reflectivity and lighting of the color/material that is about to be applied to a surface. All colors and materials are then applied to the kitchen. Lighting effects are then applied to the kitchen, as well as a camera location that represents the desired view angle for the rendering of the kitchen.

The lighting and camera lens are reviewed and modified to achieve the desired look. The entire 3D environment is then submitted to a rendering farm of multiple computers that create each major surface in an individual graphic or layer. Each of these layers are then verified against the supplied actual color/material samples to ensure accuracy. For the Cabinetry layers there may be an additional production step required to manually digitally apply the glazing and burnished/vintage effects directly to the graphic layer. Upon completion of all graphic layers, each image is uploaded via a conventional file transfer protocol for use in reassembling the layers along with the kitchen layouts into the desired "visualize-in-kitchen" imagery.

It may be contemplated by a person of ordinary skill in the art that the mouse 118, the keyboard 116 and the touch screen 122 may be communicably connected to the processor 112. The user selections via the mouse 118, the keyboard 116 and the touch screen 122 may be communicated to the processor 112 via known communication techniques and protocols known in the art.

While aspects of the present disclosure have seen particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. An interior designing system for selecting and reviewing furnishings and fixtures in a room, and visualizing the selected furnishings and fixtures in the room, the interior designing system including:
   at least one user interface including at least one display and at least one input; and
   at least one computer having at least one processor, random access memory, and permanent memory, wherein the at least one processor is configured to:
   display a plurality of room layouts;
   receive a user selection of a room layout from the plurality of room layouts, by at least one user interface;
   display a selected room layout and a plurality of objects that can be placed within the selected room layout;
   receive a selection of a first object, one or more positional parameters of the first object within the selected room layout;
   modify, based on user input, one or more design parameters of the first object wherein the design parameters include a material of the first object, a sizing of the first object, a shape of the first object, outer structure of the first object and the inner structure of the first object; and
   render one or more of a photorealistic 3D or 2D view of the first object within the selected room layout based on the received selection of the first object, the one or more positional parameters of the first object and the modified one or more design parameters of the first object.

2. The interior designing system as claimed in claim 1 wherein the processor is configured to:
   receive a selection of a one or more objects, one or more positional parameters for each of the one or more objects within the selected room layout;
   modify, based on user input, one or more design parameters of each of the one or more objects; and
   render a final set of one or more of a photorealistic 3D or 2D view of the first object and the one or more objects within the selected room layout.

3. The interior designing system as claimed in claim 2 wherein the processor is configured to compute the cost of manufacturing the first object and the one or more objects as depicted in the photorealistic 3D or 2D view.

4. The interior designing system as claimed in claim 3 wherein the processor is configured to compute the cost of transporting first object and the one or more objects to a home site, and the cost of assembling and installing the manufactured first object and the one or more objects at a home-site.

5. The interior designing system as claimed in claim 2 wherein the processor is configured to delete one or more of the first object and the one or more objects from the photorealistic 3D or 2D renditions as desired by the user.

6. The interior designing system as claimed in claim 2 wherein the processor is configured to provide information to a user to locate the first object and the one or more objects at a specific location in a market space.

7. A method for selecting and reviewing furnishings and fixtures for a room, and visualizing the selected furnishings and fixtures in the room, the method comprising:
- displaying, on a display, a plurality of room layouts;
- receiving, by a processor, a selection of a room layout from the plurality of room layouts, by a user, from the at least one user interface;
- displaying, on the display, a selected room layout and a plurality of objects that can be placed within the selected room layout;
- receiving, by the processor, a selection of a first object and one or more positional parameters of the first object within the selected room layout from at least one user interface;
- modifying, by the processor, based on user input, one or more design parameters of the first object, wherein the design parameters include a material of the first object, a sizing of the first object, a shape of the first object, outer structure of the first object and the inner structure of the first object; and
- rendering, by the processor, one or more of a photorealistic 3D or 2D view of the first object within the selected room layout based on the received selection of the first object, the one or more positional parameters of the first object and the modified one or more design parameters of the first object.

8. The method as claimed in claim 7 further comprising:
- receiving, by the processor, a selection of a one or more objects and one or more positional parameters for each of the one or more objects within the selected room layout;
- modifying, by the processor, based on user input, one or more design parameters of each of the one or more objects; and
- rendering, by the processor, on the display, a final set of one or more of a photorealistic 3D or 2D view of the first object and the one or more objects within the selected room layout.

9. The method as claimed in claim 8 further comprising computing, by the processor, a cost of manufacturing the first object and the one or more objects as depicted in the photorealistic 3D or 2D view.

10. The method as claimed in claim 9 further comprising computing the cost of transporting first object and the one or more objects to a home site, and the cost of assembling and installing the manufactured first object and the one or more objects at the home-site.

11. The method as claimed in claim 8 further comprising deleting, by the processor, one or more of the first object and the one or more objects from the photorealistic 3D or 2D renditions as desired by the user.

12. The method as claimed in claim 8 further comprising providing, by the processor, information to the user to locate the first object and the one or more objects at a specific location in a market space.

13. One or more non-transitory computer-readable media comprising computer-executable instructions that when executed, cause a computing system to perform a method for selecting and reviewing furnishings and fixtures for a room, and visualizing the selected furnishings and fixtures in the room, the method comprising:
- displaying a plurality of room layouts;
- receiving a user selection of a room layout from the plurality of room layouts;
- displaying a selected room layout and a plurality of objects that can be placed within the selected room layout;
- receiving a selection of a first object and one or more positional parameters of the first object within the selected room layout from at least one user interface;
- modifying, based on user input, one or more design parameters of the first object wherein the design parameters include a material of the first object, a sizing of the first object, a shape of the first object, outer structure of the first object and the inner structure of the first object; and
- rendering one or more of a photorealistic 3D or 2D view of the first object within the selected room layout based on the received selection of the first object, the one or more positional parameters of the first object and the modified one or more design parameters of the first object.

* * * * *